(12) United States Patent
Shin

(10) Patent No.: US 8,624,629 B2
(45) Date of Patent: Jan. 7, 2014

(54) PHASE DIFFERENCE QUANTIZATION CIRCUIT

(75) Inventor: Dong-Suk Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 13/528,148

(22) Filed: Jun. 20, 2012

(65) Prior Publication Data

US 2013/0169337 A1  Jul. 4, 2013

(30) Foreign Application Priority Data

Dec. 29, 2011  (KR) .......................... 10-2011-0146281

(51) Int. Cl.
*G01R 25/00* (2006.01)

(52) U.S. Cl.
USPC ................................ 327/3; 327/270; 327/271

(58) Field of Classification Search
USPC .......................................... 327/2, 3, 269–271
See application file for complete search history.

(56) References Cited

U.S. PATENT DOCUMENTS

| 7,978,111 B2 * | 7/2011 | Sun et al. ........................ 341/155 |
| 8,098,085 B2 * | 1/2012 | Wang et al. ........................ 327/8 |
| 2010/0226189 A1 | 9/2010 | Choi |

FOREIGN PATENT DOCUMENTS

KR  1020100049943  5/2010

* cited by examiner

*Primary Examiner* — William Hernandez
(74) *Attorney, Agent, or Firm* — IP & T Group LLP

(57) ABSTRACT

A delay value control circuit of a phase difference quantization circuit, wherein the phase difference quantization circuit has first to $N^{th}$ (N is an integer equal to or greater than 2) delay units with binary weights. The delay value control circuit includes a replica delay unit replicating an $A^{th}$ ($2 \leq A \leq N$) delay unit; and a delay control unit configured to compare a phase of a first output signal generated from delaying an input signal with an $A-1^{th}$ delay unit and a phase of a second output signal generated from delaying the input signal with the $A^{th}$ delay unit and the replica delay unit and configured to control a delay value of the $A^{th}$ delay unit using a comparison result.

4 Claims, 11 Drawing Sheets

PHASE DIFFERENCE QUANTIZATION CIRCUIT

CROSS-REFERENCE TO RELATED APPLICATIONS

The present application claims priority of Korean Patent Application No. 10-2011-0146281, filed on Dec. 29, 2011, which is incorporated herein by reference in its entirety.

BACKGROUND

1. Field

Exemplary embodiments of the present invention relate to a phase difference quantization circuit for quantizing a phase difference between two signals into digital codes, a delay value control circuit of the phase difference quantization circuit, and a delay circuit capable of calibrating a delay value.

2. Description of the Related Art

A phase difference quantization circuit is a circuit which generates digital codes corresponding to a phase difference between two signals with different phases.

FIG. 1 is a diagram showing a conventional phase difference quantization circuit.

FIG. 1 illustrates a phase difference quantization circuit which includes four phase comparison units 150, 250, 350 and 450 and three delay units 100, 200 and 300.

The first phase comparison unit 150 is configured to compare the phases of the signal loaded on a first first-node AD1 and the signal loaded on a first second-node AD2, generate a first up/down signal Q<4> and transfer the generated first up/down signal Q<4> to the first delay unit 100.

The first delay unit 100 is configured to transfer the signal loaded on the first first-node AD1 to a second first-node BD1 and the signal loaded on the first second-node AD2 to a second second-node BD2. At this time, the first delay unit 100 selects any one of the signal loaded on the first first-node AD1 and the signal loaded on the first second-node AD2 in response to the first up/down signal Q<∝>, delays the selected signal by a first delay value, and transfers the delayed signal.

The second phase comparison unit 250 is configured to compare the phases of the signal loaded on the second first-node BD1 and the signal loaded on the second second-node BD2, generate a second up/down signal Q<3> and transfer the generated second up/down signal Q<3> to the second delay unit 200.

The second delay unit 200 is configured to transfer the signal loaded on the second first-node BD1 to a third first-node CD1 and the signal loaded on the second second-node BD2 to a third second-node CD2. At this time, the second delay unit 200 selects any one of the signal loaded on the second first-node BD1 and the signal loaded on the second second-node BD2 in response to the second up/down signal Q<3>, delays the selected signal by a second delay value, and transfers the delayed signal.

The third phase comparison unit 350 is configured to compare the phases of the signal loaded on the third first-node CD1 and the signal loaded on the third second-node CD2, generate a third up/down signal Q<2> and transfer the generated third up/down signal Q<2> to the third delay unit 300.

The third delay unit 300 is configured to transfer the signal loaded on the third first-node CD1 to a fourth first-node DD1 and the signal loaded on the third second-node CD2 to a fourth second-node DD2. At this time, the third delay unit 300 selects any one of the signal loaded on the third first-node CD1 and the signal loaded on the third second-node CD2 in response to the third up/down signal Q<2>, delays the selected signal by a third delay value, and transfers the delayed signal.

The fourth phase comparison unit 450 is configured to compare the phases of the signal loaded on the fourth first-node DD1 and the signal loaded on the fourth second-node DD2 and generate a fourth up/down signal Q<1>.

FIG. 2 is a timing diagram showing operations of the conventional phase difference quantization circuit shown in FIG. 1. For illustration purposes, it is assumed that the first delay value of the first delay unit 100 is 40 ps (picoseconds), the second delay value of the second delay unit 200 is 20 ps, and the third delay value of the third delay unit 300 is 10 ps. Furthermore, it is assumed that the phase of a first input signal IN1 is earlier than the phase of a second input signal IN2 by 65 ps. The first input signal IN1 and the second input signal IN2 with difference phases are inputted to the first phase comparison unit 150 through the first first-node AD1 and the first second-node AD2, respectively. Since the phase of the signal loaded on the first first-node AD1 (that is, the first input signal IN1) is earlier than the phase of the signal loaded on the first second-node AD2 (that is, the second input signal IN2), the first phase comparison unit 150 outputs the first up/down signal Q<4> of a high level to the first delay unit 100. The first delay unit 100 is inputted with the signal loaded on the first first-node AD1 and the signal loaded on the first second-node AD2, delays the signal loaded on the first first-node AD1 by 40 ps in response to the first up/down signal Q<4> of the high level, transfers the delayed signal to the second first-node BD1, and transfers the signal loaded on the first second-node AD2 to the second second-node BD2 as is without further delaying the signal.

The second phase comparison unit 250 compares the phases of the signals loaded on the second first-node BD1 and the second second-node BD2. Since the phase of the signal loaded on the second first-node BD1 is earlier by 25 ps than the phase of the signal loaded on the second second-node BD2, the second phase comparison unit 250 outputs the second up/down signal Q<3> of a high level to the second delay unit 200. The second delay unit 200 is inputted with the signals loaded on the second first-node BD1 and the second second-node BD2, delays the signal loaded on the second first-node BD1 by 20 ps in response to the second up/down signal Q<3> of the high level, transfers the delayed signal to the third first-node CD1, and transfers the signal loaded on the second second-node BD2 to the third second-node CD2 as is without further delaying the signal.

The third phase comparison unit 350 compares the phases of the signals loaded on the third first-node CD1 and the third second-node CD2. Since the phase of the signal loaded on the third first-node CD1 is earlier by 5 ps than the phase of the signal loaded on the third second-node CD2, the third phase comparison unit 350 outputs the third up/down signal Q<2> of a high level to the third delay unit 300. The third delay unit 300 is inputted with the signals loaded on the third first-node CD1 and the third second-node CD2, delays the signal loaded on the third first-node CD1 by 10 ps in response to the third up/down signal Q<2> of the high level, transfers the delayed signal to the fourth first-node DD1, and transfers the signal loaded on the third second-node CD2 to the fourth second-node DD2 as is without further delaying the signal.

The fourth phase comparison unit 450 compares the phases of the signals loaded on the fourth first-node DD1 and fourth second-node DD2. Since the phase of the signal loaded on the fourth second-node DD2 is earlier by 5 ps than the phase of the signal loaded on the fourth first-node DD1, the fourth phase comparison unit 450 outputs the fourth up/down signal Q<1> of a low level.

As a consequence, binary codes that represent the phase difference between the first input signal IN1 and the second input signal IN2 are acquired as 1110 by combining the first to fourth up/down signals Q<4:1>. The fourth bit Q<4> indicates that the phase of which signal of the input signals IN1 and IN2 is earlier. Since the fourth bit is 1, it is meant that the phase of the first input signal IN1 is earlier than the phase of the second input signal IN2. The remaining three bits indicate an actual phase difference between the signals IN1 and IN2. That is to say, it can be seen that the phase difference between the signals IN1 and IN2 is larger than 1*40 ps+1*20 ps and is smaller than 1*40 ps+1*20 ps+1*10 ps.

The delay values of the delay units 100, 200 and 300 constituting the phase difference quantization circuit generally have a constant ratio (2:1). In other words, the delay value 40 ps of the first delay unit 100 and the delay value 20 ps of the second delay unit 200 have the ratio of 2:1, and the delay value 20 ps of the second delay unit 200 and the delay value 10 ps of the third delay unit 300 have the ratio of 2:1.

However, the delay values of the delay units 100, 200 and 300 constituting the phase difference quantization circuit are likely to change due to a variation in PVT (process, voltage and temperature). If the delay values of the delay units 100, 200 and 300 change, the delay value ratio between the delay units 100, 200 and 300 may deviate. If the delay value ratio between the delay units 100, 200 and 300 deviates, binary codes which precisely reflect the phase difference between two signals may not be generated.

SUMMARY

An embodiment of the present invention is directed to a delay value control circuit of a phase difference quantization circuit, which can perform a control task in such a manner that the delay value ratios of delay units constituting the phase difference quantization circuit can be kept constant.

Another embodiment of the present invention is directed to a phase difference quantization circuit which can generate digital codes indicating a phase difference between two signals and can keep the delay value ratios of delay units constant.

Another embodiment of the present invention is directed to a delay circuit for delaying a signal, in which delay value ratios of delay units constituting the delay circuit can be kept constant.

In accordance with an embodiment of the present invention, a delay value control circuit of a phase difference quantization circuit, wherein the phase difference quantization circuit has first to $N^{th}$ (N is an integer equal to or greater than 2) delay units with binary weights, includes: a replica delay unit replicating an $A^{th}$ (2≤A≤N) delay unit; and a delay control unit configured to compare a phase of a first output signal generated from delaying an input signal with an $A-1^{th}$ delay unit and a phase of a second output signal generated from delaying the input signal with the $A^{th}$ delay unit and the replica delay unit and configured to control a delay value of the $A^{th}$ delay unit using a comparison result.

In accordance with another embodiment of the present invention, a phase difference quantization circuit includes: a path selection unit configured to transfer a first input signal to a first first-node and a second input signal to a first second-node in a normal mode and transfer the first input signal to the first first-node and the first second-node in a calibration mode; a first phase comparison unit configured to compare a phase of a signal loaded on the first first-node and a phase of a signal loaded on the first second-node and generate a first up/down signal; a first delay unit configured to is transfer the signal loaded on the first first-node to a second first-node and the signal loaded on the first second-node to a second second-node, wherein the first delay unit is further configured to select one of the signal loaded on the first first-node and the signal loaded on the first second-node in response to the first up/down signal, delay the selected signal by a first delay value and transfer the delayed signal; a second phase comparison unit configured to compare a phase of a signal loaded on the second first-node and a phase of a signal loaded on the second second-node and generate a second up/down signal; a second delay unit configured to transfer the signal loaded on the second first-node to a third first-node and the signal loaded on the second second-node to a third second-node, wherein the second delay unit is further configured to select one of the signal loaded on the second first-node and the signal loaded on the second second-node in response to the second up/down signal, delay the selected signal by a second delay value and transfer the delayed signal; a first replica delay unit replicating the second delay unit and configured to transfer a signal loaded on the third first-node to a third third-node and a signal loaded on the third second-node to a third fourth-node, wherein the first replica delay unit is further configured to select one of the signal loaded on the third first-node and the signal loaded on the third second-node in response to the second up/down signal, delay the selected signal by the second delay value and transfer the delayed signal; a first delay control unit configured to compare a phase of a signal loaded on the third third-node and a phase of a signal loaded on the third fourth-node and control the second delay value of the second delay unit using a comparison result; and a third phase comparison unit configured to compare a phase of the signal loaded on the third first-node and a phase of the signal loaded on the third second-node and generate a third up/down signal.

In accordance with yet another embodiment of the present invention, a delay circuit includes: a first delay unit configured to add a delay of K (K is an integer equal to or greater than 2) unit delays; a second delay unit configured to add a delay of one unit delay; K−1 replica delay units replicating the second delay unit; a delay control unit configured to compare a phase of a first output signal generated from delaying an input signal with the first delay unit and a phase of a second output signal generated from delaying the input signal with the second delay unit and the K−1 replica delay units and configured to control a delay value of the second delay unit using a comparison result.

DETAILED DESCRIPTION

Figure 1:
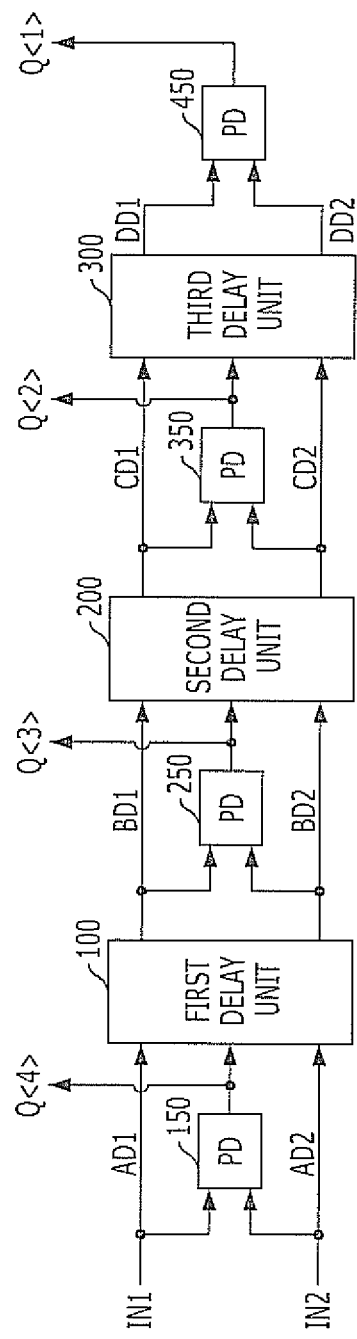
FIG. 1 is a diagram showing a conventional phase difference quantization circuit.
Figure 2:
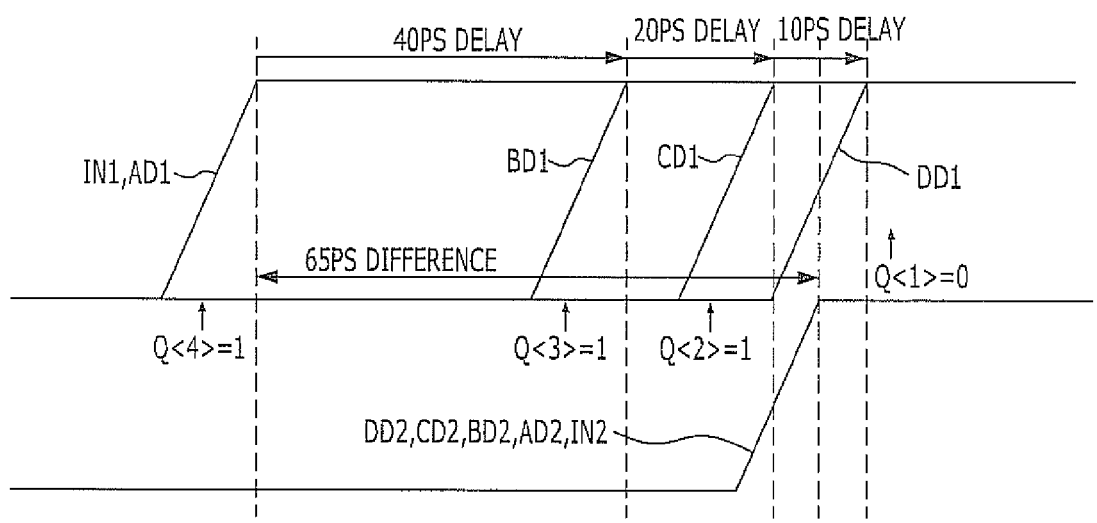
FIG. 2 is a timing diagram showing operations of the conventional phase difference quantization circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
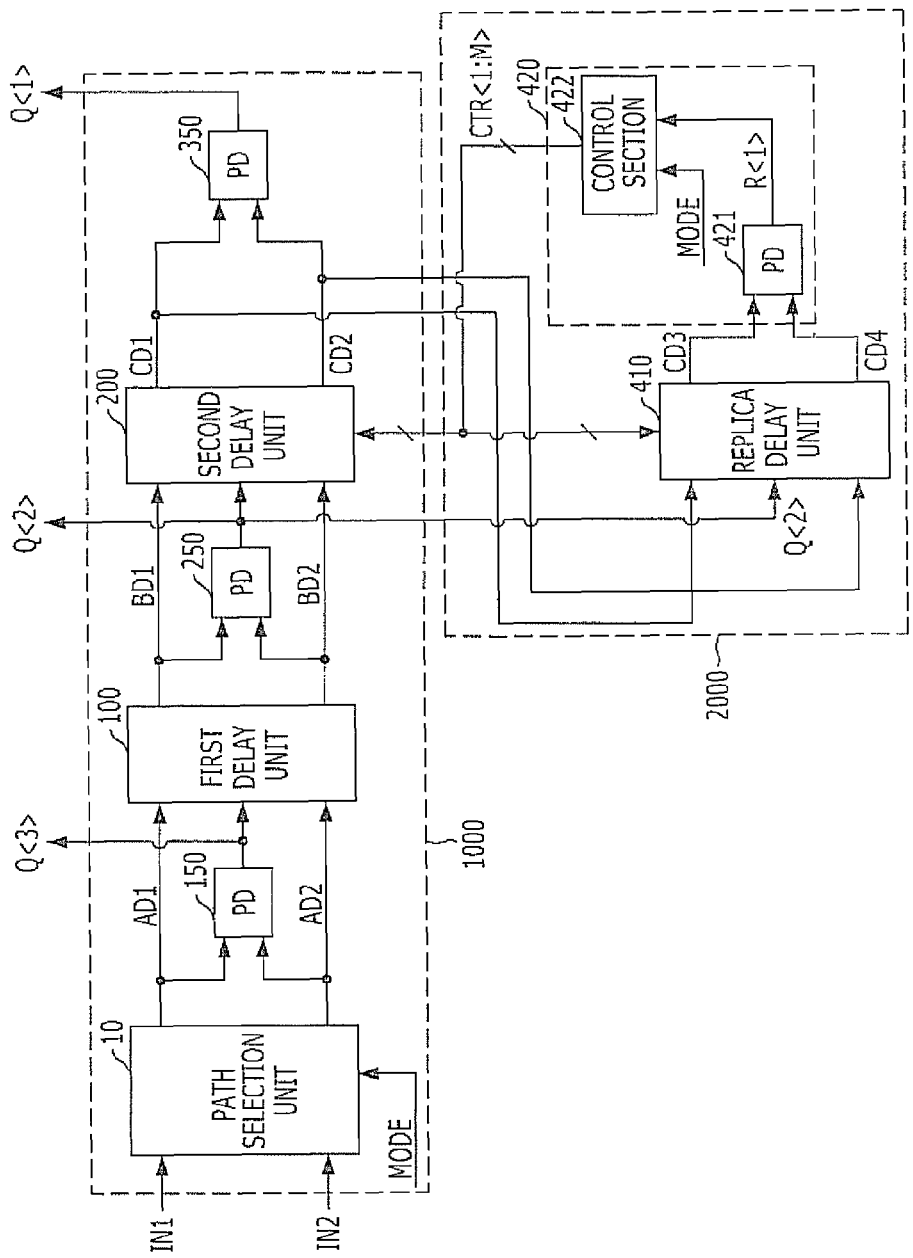
FIG. 3 is a diagram showing a phase difference quantization circuit and a delay value control circuit in accordance with an embodiment of the present invention.

FIG. 3 is a diagram showing a phase difference quantization circuit 1000 and a delay value control circuit 2000 in accordance with an embodiment of the present invention.

The phase difference quantization circuit 1000 may include N (N is an integer equal to or greater than 2) number of delay units and N+1 number of phase comparison units. The N number of delay units have a certain delay value ratio (in detail, of 2:1). More specifically, the delay value of a first delay unit is two times the delay value of a second delay unit, the delay value of the second delay unit is two times the delay value of a third delay unit, . . . , and the delay value of an N−1$^{th}$ delay unit is two times the delay value of the N$^{th}$ delay unit. For illustration purposes, FIG. 3 illustrates that the phase difference quantization circuit 1000 includes two delay units 100 and 200 and three phase comparison units 150, 250 and 350.

The first phase comparison unit 150 is configured to compare the phases of the signal loaded on a first first-node AD1 and the signal loaded on a first second-node AD2, generate a first up/down signal Q<3> and transfer the generated first up/down signal Q<3> to the first delay unit 100. The first phase comparison unit 150 outputs the first up/down signal Q<3> of a high level to the first delay unit 100 when the signal loaded on the first first-node AD1 is earlier than the signal loaded on the first second-node AD2, and outputs the first up/down signal Q<3> of a low level to the first delay unit 100 when the signal loaded on the first second-node AD2 is earlier than the signal loaded on the first first-node AD1. Meanwhile, the first phase comparison unit 150 may be designed to perform the above-described phase comparison operation in response to a mode signal MODE. Here, the mode signal MODE is a signal which represents a normal mode or a calibration mode. In detail, the mode signal MODE of a high level may be controlled so as to represent the calibration mode and the mode signal MODE of a low level may be controlled so as to represent the normal mode. In other words, the first phase comparison unit 150 may be designed in such a way as to compare the phases of the two input signals and output the first up/down signal Q<3> to the first delay unit 100 in the normal mode (that is, when the mode signal MODE has the low level) and unconditionally output the first up/down signal Q<3> of the low level to the first delay unit 100 without performing the above-described comparison operation in the calibration mode (that is, when the mode signal MODE has the high level).

The first delay unit 100 is configured to transfer the signal loaded on the first first-node AD1 to a second first-node BD1 and the signal loaded on the first second-node AD2 to a second second-node BD2. At this time, the first delay unit 100 selects any one of the signal loaded on the first first-node AD1 and the signal loaded on the first second-node AD2 in response to the first up/down signal Q<3>, delays the selected signal by a first delay value, and transfers the delayed signal.

The second phase comparison unit 250 is configured to compare the phases of the signal loaded on the second first-node BD1 and the signal loaded on the second second-node BD2, generate a second up/down signal Q<2> and transfer the generated second up/down signal Q<2> to the second delay unit 200.

The second delay unit 200 is configured to transfer the signal loaded on the second first-node BD1 to a third first-node CD1 and the signal loaded on the second second-node BD2 to a third second-node CD2. At this time, the second delay unit 200 selects any one of the signal loaded on the second first-node BD1 and the signal loaded on the second second-node BD2 in response to the second up/down signal Q<2>, delays the selected signal by a second delay value, and transfers the delayed signal.

The third phase comparison unit 350 is configured to compare the phases of the signal loaded on the third first-node CD1 and the signal loaded on the third second-node CD2 and generate a third up/down signal Q<1>.

The delay value control circuit 2000 for controlling the delay values of the respective delay units 100 and 200 constituting the phase difference quantization circuit 1000 controls the delay values using two signals with the same phase. FIG. 3 illustrates the case where a path selection unit 10 is separately disposed to allow two signals with the same phase to be inputted to the phase difference quantization circuit 1000. In detail, the path selection unit 10 is configured to select the output nodes of two input signals IN1 and IN2 in response to the mode signal MODE. Namely, the path selection unit 10 transfers the first input signal IN1 to the first first-node AD1 and the second input signal IN2 to the first second-node AD2 in the normal mode (that is, when the mode signal MODE has the low level), and transfers the first input signal IN1 to the first first-node AD1 and the first second-node AD2 in the calibration mode (that is, when the mode signal MODE has the high level). Of course, the path selection unit 10 may be designed such that the second input signal IN2 is loaded on the first first-node AD1 and the first second-node AD2 in the calibration mode (that is, when the mode signal MODE has the high level).

The delay value control circuit 2000 may include a replica delay unit 410 configured in the same way as the second delay unit 200 and a delay control unit 420 configured to control the second delay value of the second delay unit 200. Of course, in the case where the phase difference quantization circuit 1000 includes N number of delay units, the delay value control circuit 2000 may include a first replica delay unit configured in the same way as a second delay unit, a second replica delay unit configured in the same way as a third delay unit, . . . , an N−1$^{th}$ replica delay unit configured in the same way as an N$^{th}$ delay unit, a first delay control unit configured to control the delay value of the second delay unit, a second delay control unit configured to control the delay value of the third delay unit, . . . , and an N–1$^{th}$ delay control unit configured to control the delay value of the N$^{th}$ delay unit.

The replica delay unit 410 is configured in the same way as the second delay unit 200, and the delay value of the replica delay unit 410 is the same as the second delay value of the second delay unit 200. The replica delay unit 410 is inputted with the two signals outputted from the second delay unit 200 (that is, the signal loaded on the third first-node CD1 and the signal loaded on the third second-node CD2), selects any one of the two inputted signals in response to the second up/down signal Q<2>, delays the selected signal by the second delay value and outputs the delayed signal to the delay control unit 420 and does not delay but output the remaining one signal to the delay control unit 420 as is.

The delay control unit 420 is inputted with the signals loaded on a third third-node CD3 and a third fourth-node CD4, compares the phases of the signals, and controls the second delay value of the second delay unit 200 using a comparison result. In detail, the delay control unit 420 may include a calibrating phase comparing section 421 and a control section 422.

The calibrating phase comparing section 421 is configured to compare the phases of the signal loaded on the third third-node CD3 and the signal loaded on the third fourth-node CD4, generate a calibrating up/down signal R<1> and output the calibrating up/down signal R<1> to the control section 422. In detail, the calibrating phase comparing section 421 may be designed to generate the calibrating up/down signal R<1> of a high level in the case where the phase of the signal loaded on the third third-node CD3 is earlier than the phase of the signal loaded on the third fourth-node CD4 and generate the calibrating up/down signal R<1> of a low level in an opposite case.

The control section 422 is configured to generate delay codes CTR<1:M> for controlling the delay value of the second delay unit 200 and the replica delay unit 410 in response to the calibrating up/down signal R<1>. In detail, the control section 422 may be designed in such a way as to increase the value of the delay codes CTR<1:M> when the calibrating up/down signal R<1> has the high level and decrease the value of the delay codes CTR<1:M> when the calibrating up/down signal R<1> has the low level. This will be described below in detail with reference to FIG. 4. Since the control section 422 operates in, for example, the calibration mode (that is, when the mode signal MODE has the high level) only, the delay codes CTR<1:M> may be designed so that they are not changed in the normal mode (that is, when the mode signal MODE has the low level) to lock the delay value of the second delay unit 200.

The delay control unit 420 controls the delay codes CTR<1:M> and transfers the controlled delay codes CTR<1: M> to the second delay unit 200 during the calibration mode, that is, during a period in which the mode signal MODE is activated to the high level. The second delay value of the second delay unit 200 is controlled in response to the inputted delay codes CTR<1:M>. The second delay value of the second delay unit 200 is finally controlled by the delay codes CTR<1:M> when the calibration mode is ended, that is, when the mode signal MODE transitions from the high level to the low level.

Figure 4:
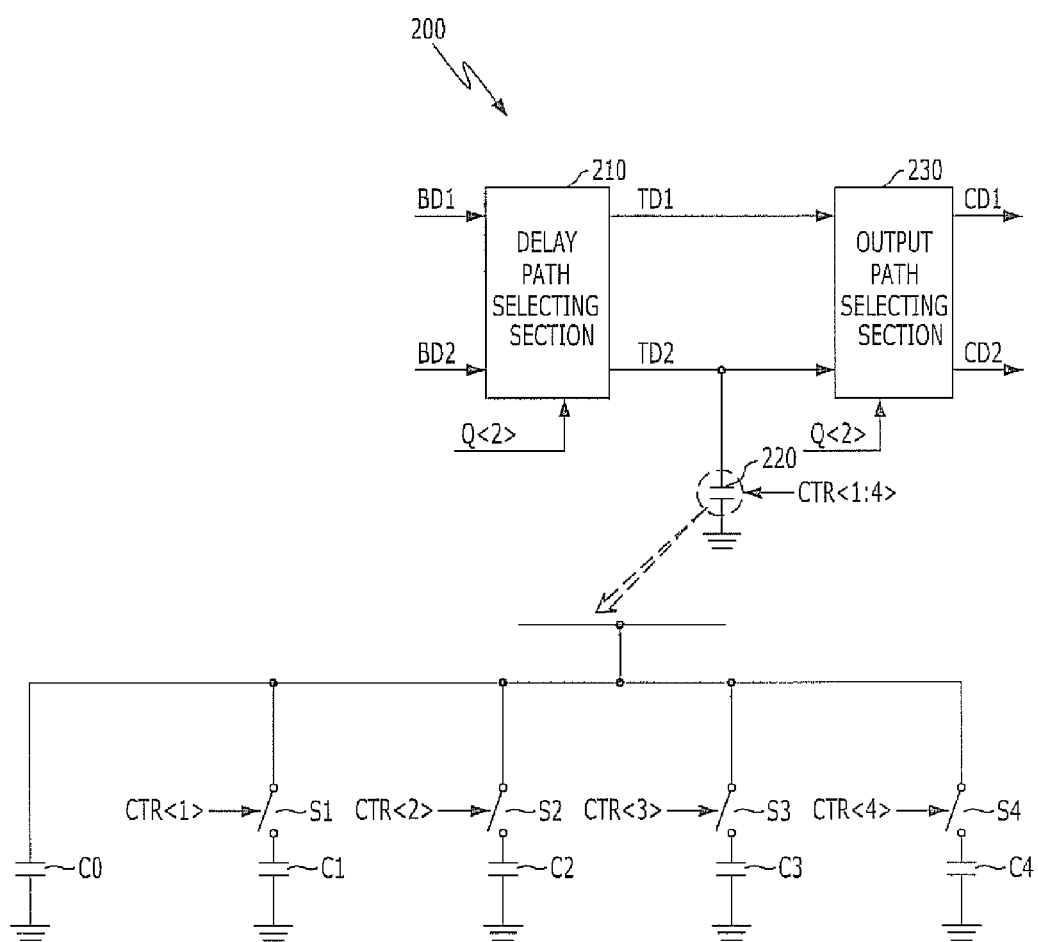
FIG. 4 is a diagram showing an exemplary embodiment of the second delay unit shown in FIG. 3.

FIG. 4 is a diagram showing an exemplary embodiment of the second delay unit 200 shown in FIG. 3.

The second delay unit 200 may include a delay path selecting section 210, a capacitor section 220, and an output path selecting section 230.

The delay path selecting section 210 is configured to select the delay paths of the signal loaded on the second first-node BD1 and the signal loaded on the second second-node BD2 in response to the second up/down signal Q<2>. In detail, the delay path selecting section 210 may be designed in such a way as to transfer the signal loaded on the second first-node BD1 to a second transmission node TD2 and the signal loaded on the second second-node BD2 to a first transmission node TD1 when the second up/down signal Q<2> has a high level and transfer the signal loaded on the second first-node BD1 to the first transmission node TD1 and the signal loaded on the second second-node BD2 to the second transmission node TD2 when the second up/down signal Q<2> has a low level.

The capacitor section 220 is connected to the second transmission node TD2 and is configured to delay the signal loaded on the second transmission node TD2 by a delay value determined by total capacitance and transfer the delayed signal to the output path selecting section 230. The capacitor section 220 may include a capacitor C0, a plurality of switches S1 to S4 and a plurality of capacitors C1 to C4 which are connected in series to the plurality of switches S1 to S4. For illustration purposes, FIG. 4 shows an example where the capacitor section 220 includes the five capacitors C0 to C4. The plurality of switches S1 to S4 are turned on and off in response to delay codes CTR<1:4>. The zeroth capacitor C0 has a capacitance of a large level, and the first to fourth capacitors C1 to C4 have the same capacitance of a relatively small level. The total capacitance of the capacitor section 220 is the sum of the capacitance of the zeroth capacitor C0 and the capacitances of capacitors connected to turn-on switches. The signal loaded on the second transmission node TD2 is delayed by the delay value determined by the total capacitance of the capacitor section 220. When the total capacitance is large, it takes a long time to charge/discharge charges and the magnitude of the delay value increases, and when the total capacitance is small, the magnitude of the delay value decreases. Of course, while FIG. 4 shows an example where the capacitances of the capacitors C1 to C4 connected to the plurality of switches S1 to S4 have the same magnitude, the capacitances of the capacitors C1 to C4 may be different according to different design needs. For example, the capacitor section 220 may be designed such that the capacitance of the first capacitor C1 is two times the capacitance of the second capacitor C2, the capacitance of the second capacitor C2 is two times the capacitance of the third capacitor C3 and the capacitance of the third capacitor C3 is two times the capacitance of the fourth capacitor C4.

The output path selecting section 230 is configured to select the output paths of the signal loaded on the first transmission node TD1 and the signal loaded on the second transmission node TD2 in response to the second up/down signal Q<2>. In detail, the output path selecting section 230 may be designed in such a way as to transfer the signal loaded on the second transmission node TD2 to the third first-node CD1 and the signal loaded on the first transmission node TD1 to the third second-node CD2 when the second up/down signal Q<2> has the high level and transfer the signal loaded on the first transmission node TD1 to the third first-node CD1 and the signal loaded on the second transmission node TD2 to the third second-node CD2 when the second up/down signal Q<2> has the low level.

That is to say, the second delay unit 200 selects any one of the signal loaded on the second first-node BD1 and the signal loaded on the second second-node BD2, delays the selected signal using the capacitor section 220 and outputs the delayed signal, in response to the second up/down signal Q<2>.

Operations of the delay control unit 420 and the second delay unit 200 will be described below. For example, it is assumed that the delay codes CTR<1:4> currently inputted to the second delay unit 200 are 0011. The control section 422 stores 0011 as the default value of the delay codes CTR<1:4>. If the calibrating up/down signal R<1> has the high level, the value of the delay codes CTR<1:4> is increased to 0111 and the increased value is transferred to the second delay unit 200. As the increased delay codes CTR<1:4> are inputted to the second delay unit 200, the number of capacitors to be turned on increases, and thus, the total capacitance of the capacitor section 220 increases. Consequently, the second delay value of the second delay unit 200 is increased. Conversely, if the calibrating up/down signal R<1> has the low level, the value of the delay codes CTR<1:4> is decreased from 0011 to 0001 and the decreased value is transferred to the second delay unit 200. As the decreased delay codes CTR<1:4> are inputted to the second delay unit 200, the number of capacitors to be turned on decreases, and thus, the total capacitance of the capacitor section 220 decreases. Consequently, the second delay value of the second delay unit 200 is decreased. In the meanwhile, the control section 422 may be designed in such a way as to store 0000 as the default value of the delay codes CTR<1:4>, increase/decrease the value of the delay codes CTR<1:4> in response to the calibrating up/down signal R<1> and transfer the increased/decreased value to the second delay unit 200. In this case, the second delay value is controlled as the switches S1 to S4 of the capacitor section 220 are turned on one by one in response to the delay codes CTR<1:4>, from the state in which all of them are turned off.

As a result, the delay control unit 420 controls the delay codes CTR<1:M> in response to the calibrating up/down signal R<1> and transfers the controlled delay codes CTR<1:M> to the second delay unit 200, the total capacitance of the capacitor section 220 is controlled in response to the inputted delay codes CTR<1:M>, and thus, the second delay value of the second delay unit 200 is controlled.

Figure 5:
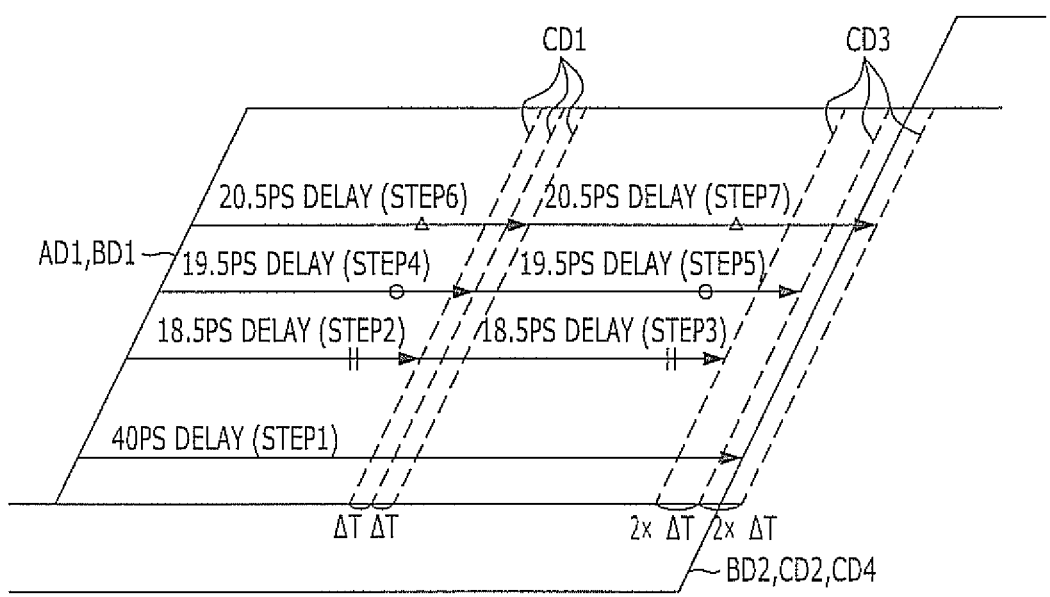
FIG. 5 is a timing diagram showing calibrating operations of the delay value control circuit shown in FIG. 3 in a calibration mode.

FIG. 5 is a timing diagram showing calibrating operations of the delay value control circuit 2000 shown in FIG. 3 in the calibration mode (that is, when the mode signal MODE has the high level). In FIG. 5, for illustration purposes, the following assumptions are made. ① The first delay value of the first delay unit 100 is 40 ps and the second delay value of the second delay unit 200 is changed from 20 ps to 18.5 ps due to a variation in PVT, and ② since the replica delay unit 410 is configured in the same way as the second delay unit 200 and a change in the delay value of the replica delay unit 410 due to the variation in PVT occurs in the same manner as in the second delay unit 200, the delay value of the replica delay unit 410 is also changed from 20 ps to 18.5 ps due to the variation in PVT. Further, ③ the delay codes CTR<1:4> currently inputted to the second delay unit 200 are 0001 and the delay control unit 420 stores 0001 as the default value of the delay codes CTR<1:4>, and ④, as the number of switches to be turned on among the switches S1 to S4 of the capacitor section 220 in response to the delay codes CTR<1:4> increases/decreases by one, the delay value of the second delay unit 200 increases/decreases by 1 ps.

In the case where the mode signal MODE indicates the calibration mode, that is, when the mode signal MODE has the high level, the path selection unit 10 transfers the first input signal IN1 to the first first-node AD1 and the first second-node AD2. The signals loaded on the first first-node AD1 and the first second-node AD2 are inputted to the first phase comparison unit 150.

Actually, the phases of the two signals inputted to the first phase comparison unit 150 may not be perfectly the same with no error. In other words, the phases of the two signals have a shade of difference due to noise, etc. on signal transfer lines, and therefore, the first phase comparison unit 150 generates and outputs the first up/down signal Q<3> of the high or low level. For example, if the phase of the signal loaded on the first first-node AD1 is earlier slightly than the phase of the signal loaded on the first second-node AD2 due to noise, etc. on signal transfer lines, the first phase comparison unit 150 generates the first up/down signal Q<3> of the high level and outputs it to the first delay unit 100. Conversely, if the phase of the signal loaded on the first second-node AD2 is earlier slightly than the phase of the signal loaded on the first first-node AD1 due to noise, etc. on the signal transfer lines, the first phase comparison unit 150 generates the first up/down signal Q<3> of the low level and outputs it to the first delay unit 100. In the meantime, while the delay value control circuit 2000 performs calibrating operations, the level of the first up/down signal Q<3> as the output signal of the first phase comparison unit 150 inputted with the two signals having the same phase is not important. Therefore, the first phase comparison unit 150 may be designed in such a way as to always generate the first up/down signal Q<3> of the low level without performing the phase comparing operation and output it to the first delay unit 100 in the calibration mode (that is, when the mode signal MODE has the high level), as described above with reference to FIG. 3. Here, for illustration purposes, the first phase comparison unit 150, inputted with the signal loaded on the first first-node AD1 and the signal loaded on the first second-node AD2 which have the same phase, generates the first up/down signal Q<3> of the low level and outputs it to the first delay unit 100.

The first delay unit 100 delays the signal loaded on the first second-node AD2 by the first delay value of 40 ps between the signals loaded on the first first-node AD1 and the first second-node AD2 and inputted thereto in response to the first up/down signal Q<3> of the low level and transfers the delayed signal to the second second-node BD2 and transfers the signal loaded on the first first-node AD1 to the second first-node BD1 as is without delaying the signal. Accordingly, the phase of the signal loaded on the second first-node BD1 becomes earlier by 40 ps than the phase of the signal loaded on the second second-node BD2 (STEP1).

The second phase comparison unit 250 compares the phases of the signals loaded on the second first-node BD1 and the second second-node BD2 and inputted thereto, and, since the phase of the signal loaded on the second first-node BD1 is earlier than the phase of the signal loaded on the second second-node BD2, generates the second up/down signal Q<2> of the high level and transfers it to the second delay unit 200. The second delay unit 200 delays the signal loaded on the second first-node BD1 by the second delay value of 18.5 ps between the signals loaded on the second first-node BD1 and the second second-node BD2 and inputted thereto in response to the second up/down signal Q<2> of the high level and transfers the delayed signal to the third first-node CD1, and transfers the signal loaded on the second second-node BD2 to the third second-node CD2 as is without delaying the signal. Accordingly, the phase of the signal loaded on the third first-node CD1 becomes earlier by 21.5 ps than the phase of the signal loaded on the third second-node CD2 (STEP2).

The second up/down signal Q<2> and the signals loaded on the third first-node CD1 and the third second-node CD2 are inputted to the replica delay unit 410. The replica delay unit 410 delays the signal loaded on the third first-node CD1 by the second delay value of 18.5 ps between the signals loaded on the third first-node CD1 and the third second-node CD2 and inputted thereto in response to the second up/down signal Q<2> of the high level and transfers the delayed signal to the third third-node CD3, and transfers the signal loaded on the third second-node CD2 to the third fourth-node CD4 as is without further delaying the signal. Accordingly, the phase of the signal loaded on the third third-node CD3 becomes earlier by 3 ps than the phase of the signal loaded on the third fourth-node CD4 (STEP3).

The calibrating phase comparing section 421 compares, the phases of the signals loaded on the third third-node CD3 and the third fourth-node CD4 and inputted thereto, and, since the phase of the signal loaded on the third third-node CD3 is earlier than the phase of the signal loaded on the third fourth-node CD4, generates the calibrating up/down signal R<1> of the high level and transfers it to the control section 422. The control section 422 increases the delay codes CTR<1:4> from 0001 to 0011 in response to the calibrating is up/down signal R<1> of the high level, and transfers it to the second delay unit 200 and the replica delay unit 410. As the third switch S3 and the fourth switch S4 of the capacitor section 220 constituting the second delay unit 200 are turned on, the total capacitance of the capacitor section 220 becomes the sum of the capacitances of the zeroth capacitor C0, the third capacitor C3 and the fourth capacitor C4. Namely, because the total capacitance of the capacitor section 220 in the second delay unit 200 is increased by the capacitance of the third capacitor C3, the second delay value of the second delay unit 200 increases by 1 ps and becomes 19.5 ps. Similarly, the second delay value of the replica delay unit 410 becomes 19.5 ps.

Subsequently, the above-described operations are repeated. That is to say, the signal loaded on the second first-node BD1 is delayed by the second delay value of 19.5 ps through the second delay unit 200 and the delayed signal is transferred to the third first-node CD1, and the signal loaded on the second second-node BD2 is not delayed and is transferred to the third second-node CD2 as is. Accordingly, the phase of the signal loaded on the third first-node CD1 becomes earlier by 20.5 ps than the phase of the signal loaded on the third second-node CD2 (STEP4).

The replica delay unit 410 delays the signal loaded on the third first-node CD1 by the second delay value of 19.5 ps in response to the second up/down signal Q<2> of the high level and transfers, the delayed signal to the third third-node CD3, and transfers the signal loaded on the third second-node CD2 to the third fourth-node CD4 as is without further delaying the signal. Accordingly, the phase of the signal loaded on the third third-node CD3 becomes earlier by 1 ps than the phase of the signal loaded on the third fourth-node CD4 (STEP5).

Since the phase of the signal loaded on the third third-node CD3 is earlier than the phase of the signal loaded on the third fourth-node CD4, the calibrating phase comparing section 421 generates the calibrating up/down signal R<1> of the high level and transfers it to the control section 422. The control section 422 increases the delay codes CTR<1:4> from 0011 to 0111 in response to the calibrating up/down signal R<1> of the high level, and transfers it to the second delay unit 200 and the replica delay unit 410. As the second switch S2, the third switch S3 and the fourth switch S4 of the capacitor section 220 constituting the second delay unit 200 are turned on, the total capacitance of the capacitor section 220 becomes the sum of the capacitances of the zeroth capacitor C0 and the second to fourth capacitors C2, C3 and C4. Namely, because the total capacitance of the capacitor section 220 in the second delay unit 200 is increased by the capacitance of the second capacitor C2, the second delay value of the second delay unit 200 increases by 1 ps and becomes 20.5 ps. Similarly, the second delay value of the replica delay unit 410 becomes 20.5 ps.

Thereupon, the above-described operations are repeated again. That is to say, the signal loaded on the second first-node BD1 is delayed by the second delay value of 20.5 ps through the second delay unit 200 and the delayed signal is transferred to the third first-node CD1, and the signal loaded on the second second-node BD2 is not delayed and is transferred to the third second-node CD2 as is. Accordingly, the phase of the signal loaded on the third first-node CD1 becomes earlier by 19.5 ps than the phase of the signal loaded on the third second-node CD2 (STEP6).

The replica delay unit 410 delays the signal loaded on the third first-node CD1 by the second delay value of 20.5 ps in response to the second up/down signal Q<2> of the high level and transfers the delayed signal to the third third-node CD3, and transfers the signal loaded on the third second-node CD2 to the third fourth-node CD4 as is without further delaying the signal. Accordingly, the phase of the signal loaded on the third fourth-node CD4 becomes earlier by 1 ps than the phase of the signal loaded on the third third-node CD3 (STEP7).

Since the phase of the signal loaded on the third fourth-node CD4 is earlier than the phase of the signal loaded on the third third-node CD3, the calibrating phase comparing section 421 generates the calibrating up/down signal R<1> of the low level and transfers it to the control section 422. The control section 422 decreases the value of the delay codes CTR<1:4> from 0111 to 0011 in response to the calibrating up/down signal R<1> of the low level and transfers it to the second delay unit 200 and the replica delay unit 410.

As a result, the delay codes CTR<1:4> is consecutively changed from 0111 to 0011 and subsequently from 0011 to 0111 until the calibration mode is ended, that is, the mode signal MODE transitions from the high level to the low level. In other words, the second delay value of the second delay unit 200 is consecutively changed from 19.5 ps to 20.5 ps and subsequently from 20.5 ps to 19.5 ps until the calibration mode is ended. When the calibration mode is ended, the second delay value of the second delay unit 200 is determined by the delay codes CTR<1:4> at that time. That is to say, the second delay value of the second delay unit 200 is locked to any one value of 19.5 ps and 20.5 ps. Through the calibrating process as described above, the first delay value of the first delay unit 100 and the second delay value of the second delay unit 200 maintain the ratio of 2:1.

While it was exemplarily explained with reference to FIG. 5 that the delay value of the second delay unit 200 is decreased due to a variation in PVT, operations opposite to those described with reference to FIG. 5 are performed in the case where the delay value of the second delay unit 200 is increased due to a variation in PVT. In detail, the delay control unit 420 performs an operation of decreasing the value of the delay codes CTR<1:4> and thereby decreasing the second delay value of the second delay unit 200.

In the meantime, even in the case where the first delay value of the first delay unit 100 is changed due to a variation in PVT, the first delay value of the first delay unit 100 and the second delay value of the second delay unit 200 may be maintained with the constant ratio of 2:1 through the above-described calibrating operations. For example, in the case where the second delay value of the second delay unit 200 is 20 ps and the first delay value of the first delay unit 100 is changed from 40 ps to 38 ps due to a variation in PVT, the second delay value of the second delay unit 200 may be controlled to 19 ps through the delay value control operation described above.

While the case in which the second delay value of the second delay unit 200 is controlled in response to the delay codes CTR<1:M> outputted from the delay control unit 420 was described as an example, the first delay value of the first delay unit 100 may be controlled in response to the delay codes CTR<1:M>. For example, in the case where the first delay value of the first delay unit 100 is 40 ps and the second delay value of the second delay unit 200 is changed from 20 ps to 18.5 ps due to a variation in PVT, the delay control unit 420 may be controlled to decrease the value of the delay codes CTR<1:4> and transfer it to the first delay unit 100 and the first delay value of the first delay unit 100 may be controlled to decrease in response to the inputted delay codes CTR<1:4>. Furthermore, in the case where the second delay value of the second delay unit 200 is 20 ps and the first delay value of the first delay unit 100 is changed from 40 ps to 38 ps due to a variation in PVT, the delay control unit 420 may increase the value of the delay codes CTR<1:4> and transfer it to the first delay unit 100 and the first delay value of the first delay unit 100 may be controlled to increase in response to the inputted delay codes CTR<1:4>.

The calibrating operations of the delay value control circuit 2000 in accordance with the embodiment of the present invention in the calibration mode (that is, when the mode signal MODE has the high level) will be summarized below. The delay value control circuit 2000 for controlling the delay value of the phase difference quantization circuit 1000 including the first delay unit 100 and the second delay unit 200 with the delay value ratio of 2:1 may include the replica delay unit 410 configured in the same way as the second delay unit 200 and the delay control unit 420 configured to control the second delay value of the second delay unit 200. The phases of a first output signal, which is generated as an input signal is delayed by the first delay value through the first delay unit 100, and a second output signal, which is generated as the input signal is delayed by (the second delay value*2) through the second delay unit 200 and the replica delay unit 410, are compared with each other, and the second delay value of the second delay unit 200 is controlled using a comparison result. Through this delay value controlling process, the second delay value of the second delay unit 200 may be controlled to be half of the first delay value of the first delay unit 100.

In other words, in the case where the phase difference quantization circuit 1000 includes first to $N^{th}$ delay units with binary weights, the delay value control circuit 2000 for controlling the delay value of the phase difference quantization circuit 1000 may include a replica delay unit configured in the same way as an $A^{th}$ delay unit and a delay control unit configured to control the delay value of the $A^{th}$ delay unit. The phases of a first output signal, which is generated as an input signal is delayed through an $A-1^{th}$ delay unit 100, and a second output signal, which is generated as the input signal is delayed through the $A^{th}$ delay unit 200 and the replica delay unit 410, are compared with each other, and the delay value of the $A^{th}$ delay unit 200 is controlled using a comparison result. Through this delay value controlling process, the delay value of the $A^{th}$ delay unit 200 may be controlled to be half of the delay value of the $A-1^{th}$ delay unit 100.

Meanwhile, in the case where the phase difference quantization circuit 1000 further includes a third delay unit (not shown), the delay value control circuit 2000 may be designed to further include a second replica delay unit (not shown) configured in the same way as the third delay unit and a second delay control unit (not shown) configured to control the third delay value of the third delay unit (hereinafter, the embodiment designed in this way will be referred to as a first modification of the embodiment shown in FIG. 3). An operation for controlling the delay value of the third delay unit may be performed after the control of the delay value of the second delay unit 200 is completed. The third delay unit may be designed such that, for example, only the delay value thereof and the signals inputted thereto and outputted therefrom are different from and the other configuration and operation are the same when compared to the second delay unit 200 shown in FIG. 4. In this case, the calibrating operations of the delay value control circuit 2000 are similar to those described with reference to FIG. 5. First, in the case of a mode in which the calibrating operation for the third delay unit is to be performed, two signals with the same phase are loaded on the second first-node BD1 and the second second-node BD2. In detail, a second path selection unit (not shown) configured similar to the path selection unit 10 described above with reference to FIG. 3 may be disposed between the first delay unit 100 and the second delay unit 200. The second path selection unit performs a control task such that signals with the same phase are loaded on the second first-node BD1 and the second second-node BD2, in the case of the mode in which the calibrating operation for the third delay unit is to be performed. Subsequently, the phases of the signal delayed by the second delay unit 200 and the signal delayed by the third delay unit and the second replica delay unit are compared with each other, and the delay value of the third delay unit is controlled using a comparison result. If the calibrating operation for the third delay unit is completed, the third delay value of the third delay unit is controlled to be ½ times the second delay value of the second delay unit 200.

Figure 6:
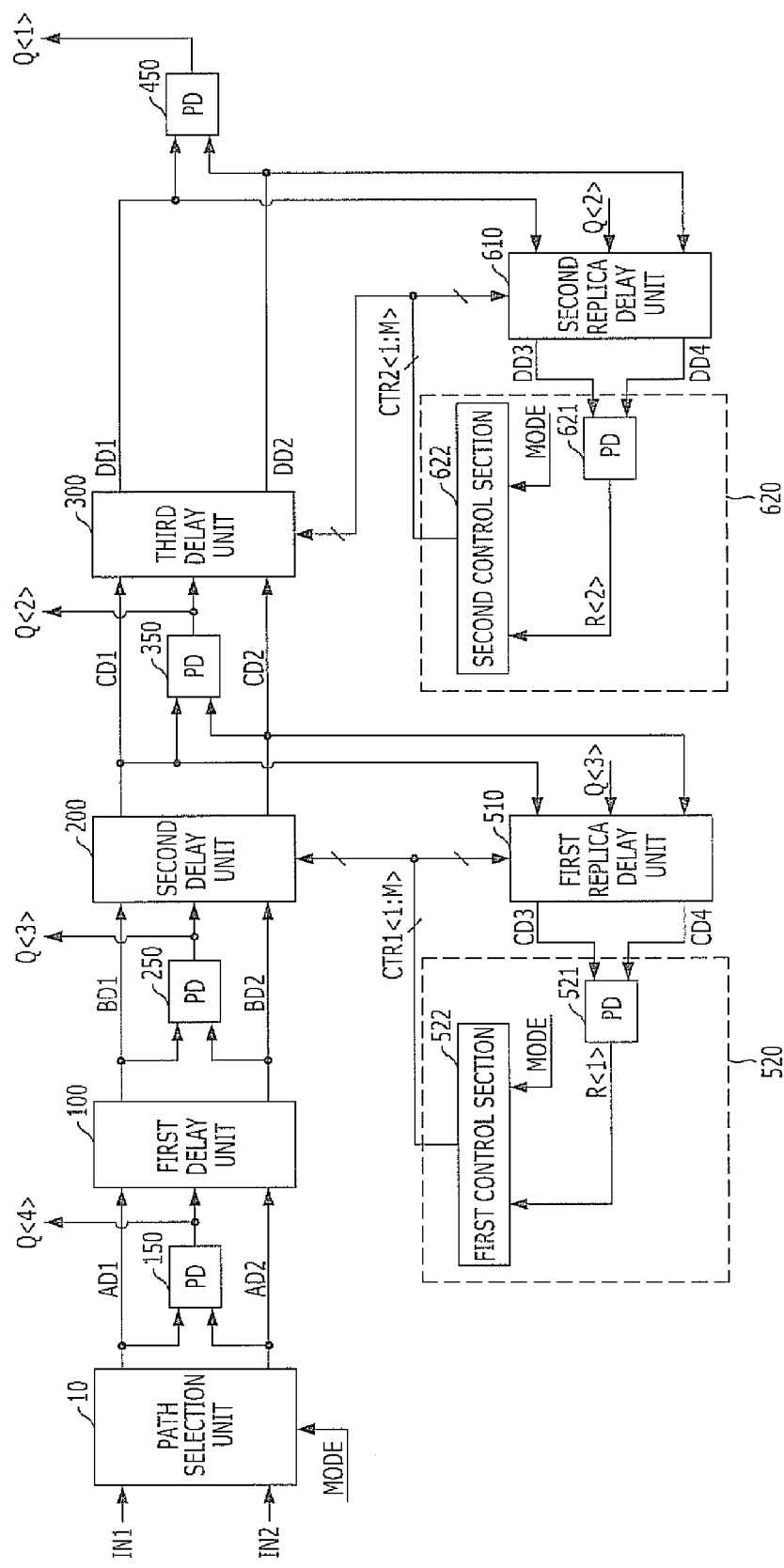
FIG. 6 is a diagram showing a phase difference quantization circuit in accordance with another embodiment of the present invention.

FIG. 6 is a diagram showing a phase difference quantization circuit in accordance with another embodiment of the present invention.

The phase difference quantization circuit may include a path selection unit 10, N+1 number of phase comparison units 150, 250, 350 and 450, N number of delay units 100, 200 and 300, N−1 number of replica delay units 510 and 610, and N−1 number of delay control units 520 and 620. For illustration purposes, FIG. 6 illustrates the case in which N is 3. The first delay value of the first delay unit 100 is two times the second delay value of the second delay unit 200, and the second delay value of the second delay unit 200 is two times the third delay value of the third delay unit 300.

The configurations and operations of the path selection unit 10, the first phase comparison unit 150, the second phase comparison unit 250, the first delay unit 100 and the second delay unit 200 shown in FIG. 6 are similar to those of the path selection unit 10, the first phase comparison unit 150, the second phase comparison unit 250, the first delay unit 100 and the second delay unit 200 described above with reference to FIG. 3.

The first replica delay unit 510 is configured in the same way as the second delay unit 200, and the delay value thereof is the same as the second delay value of the second delay unit 200. The configuration and operation of the first replica delay unit 510 are the same as those of the replica delay unit 410 described above with reference to FIG. 3.

The first delay control unit 520 is configured to compare the phases of the signals loaded on a third third-node CD3 and a third fourth-node CD4 and generate first delay codes CTR1<1:M> for controlling the second delay value of the second delay unit 200, using a comparison result. In detail, the first delay control unit 520 may include a first calibrating phase comparing section 521 configured to compare the phases of the two signals and generate a first calibrating up/down signal R<1> and a first control section 522 configured to generate the first delay codes CTR1<1:M> in response to the first calibrating up/down signal R<1>. Since the first delay control unit 520 performs the operation for controlling, for example, the first delay codes CTR1<1:M> only in the calibration mode (that is, when the mode signal MODE has the high level), the delay code controlling operation described above may be designed so as not to be performed in the normal mode (that is, when the mode signal MODE has the low level) to lock the second delay value of the second delay unit 200. The configuration and operation of the first delay control unit 520 are the same as those of the delay control unit 420 described above with reference to FIG. 3.

The third phase comparison unit 350 is configured to compare the phases of the signals loaded on a third first-node CD1 and a third second-node CD2 and generate a third up/down signal Q<2>.

The third delay unit 300 is configured to transfer the signal loaded on the third first-node CD1 to a fourth first-node DD1 and the signal loaded on the third second-node CD2 to a fourth second-node DD2 in response to the third up/down signal Q<2>. At this time, the third delay unit 300 selects any one of the signal loaded on the third first-node CD1 and the signal loaded on the third second-node CD2, delays the selected signal by the third delay value, and transfers the delayed signal. In detail, the third delay unit 300 may be designed in such a way as to delay the signal loaded on the third first-node CD1 by the third delay value and transfer the delayed signal to the fourth first-node DD1, and transfer the signal loaded on the third second-node CD2 to the fourth second-node DD2 as is without further delaying the signal, when the third up/down signal Q<2> has a high level. Furthermore, the third delay unit 300 may be designed in such a way as to delay the signal loaded on the third second-node CD2 by the third delay value and transfer the delayed signal to the fourth second-node DD2, and transfer the signal loaded on the third first-node CD1 to the fourth first-node DD1 as is without further delaying the signal, when the third up/down signal Q<2> has a low level. Meanwhile, the third delay unit 300 may be designed such that, for example, only the delay value thereof and the signals inputted thereto and outputted therefrom are different from and the other configuration and operation are the same when compared to the second delay unit 200.

The second replica delay unit 610 is configured in the same way as the third delay unit 300, and the delay value thereof is the same as the third delay value of the third delay unit 300. In detail, the second replica delay unit 610 is configured to transfer the signal loaded on the fourth first-node DD1 to a fourth third-node DD3 and the signal loaded on the fourth second-node DD2 to a fourth fourth-node DD4. At this time, the second replica delay unit 610 selects any one of the signal loaded on the fourth first-node DD1 and the signal loaded on the fourth second-node DD2 in response to the third up/down signal Q<2>, delays the selected signal by the third delay value, and transfers the delayed signal.

The second delay control unit 620 is configured to compare the phases of the signal loaded on the fourth third-node DD3 and the signal loaded on the fourth fourth-node DD4 and control the third delay value of the third delay unit 300 using a comparison result. The second delay control unit 620 may include a second calibrating phase comparing section 621 configured to compare the phases of the signal loaded on the fourth third-node DD3 and the signal loaded on the fourth fourth-node DD4 and generate a second calibrating up/down signal R<2> and a second control section 622 configured to control second delay codes CTR2<1:M> in response to the second calibrating up/down signal R<2>. Since the second delay control unit 620 performs the operation for controlling the second delay codes CTR2<1:M>, for example, only in the calibration mode (that is, when the mode signal MODE has the high level), the delay code controlling operation described above may be controlled so as not to be performed in the normal mode (that is, when the mode signal MODE has the low level) to lock the third delay value of the third delay unit 300. The second delay control unit 620 may be designed such that, for example, only the signals inputted thereto and outputted therefrom are different from and the other configuration and operation are the same when compared to the first delay control unit 520.

The fourth phase comparison unit 450 is configured to compare the phases of the signal loaded on the fourth first-node DD1 and the signal loaded on the fourth second-node DD2 and generate a fourth up/down signal Q<1>.

The operations of the phase difference quantization circuit shown in FIG. 6 will be described below.

First, operations of the phase difference quantization circuit in the normal mode (that is, when the mode signal MODE has the low level) are as follows. In the normal mode (that is, when the mode signal MODE has the low level), binary codes Q<4:1> which reflect the phase differences between two input signals IN1 and IN2 are generated. At this time, the first delay control unit 520 and the second delay control unit 620 do not operate. The fourth bit Q<4> among the generated binary codes Q<4:1> indicates which signal of the two input signals IN1 and IN2 has an earlier phase, and the remaining three bits Q<3:1> indicate an actual phase difference between the two input signals IN1 and IN2. For example, when assuming that the first delay value of the first delay unit 100 is 40 ps, the second delay value of the second delay unit 200 is 20 ps, the third delay value of the third delay unit 300 is 10 ps and the value of the binary codes Q<4:1> is 1110, since the fourth bit Q<4> is 1, the phase of the first input signal IN1 is earlier than the phase of the second input signal IN2. The phase difference therebetween is larger than 1*40 ps+1*20 ps and smaller than 1*40 ps+1*20 ps+1*10 ps.

Calibrating operations of the phase difference quantization circuit in the calibration mode (that is, when the mode signal MODE has the high level) are as follows. In the calibration mode (that is, when the mode signal MODE has the high level), the second delay value of the second delay unit 200 is calibrated based on the first delay value of the first delay unit 100. Moreover, if the control of the second delay value of the second delay unit 200 is completed, the third delay value of the third delay unit 300 is calibrated based on the second delay value of the second delay unit 200. For illustration purposes, the following assumptions are made. ①The first delay value of the first delay unit 100 is 40 ps, the second delay value of the second delay unit 200 is changed from 20 ps to 18.5 ps due to a variation in PVT and the third delay value of the third delay unit 300 is changed from 10 ps to 8.5 ps due to a variation in PVT, ② the delay value of the first replica delay unit 510 is also changed to 18.5 ps due to the variation in PVT and the delay value of the second replica delay unit 610 is also changed to 8.5 ps due to the variation in PVT, ③ each of the first delay codes CTR1<1:4> and the second delay codes CTR2<1:4> is constituted by 4 bits, and ④, as the number of capacitors to be turned in response to the second delay codes CTR2<1:4> increases/decreases by one, the third delay value of the third delay unit 300 increases/decreases by 1 ps.

Figure 7:
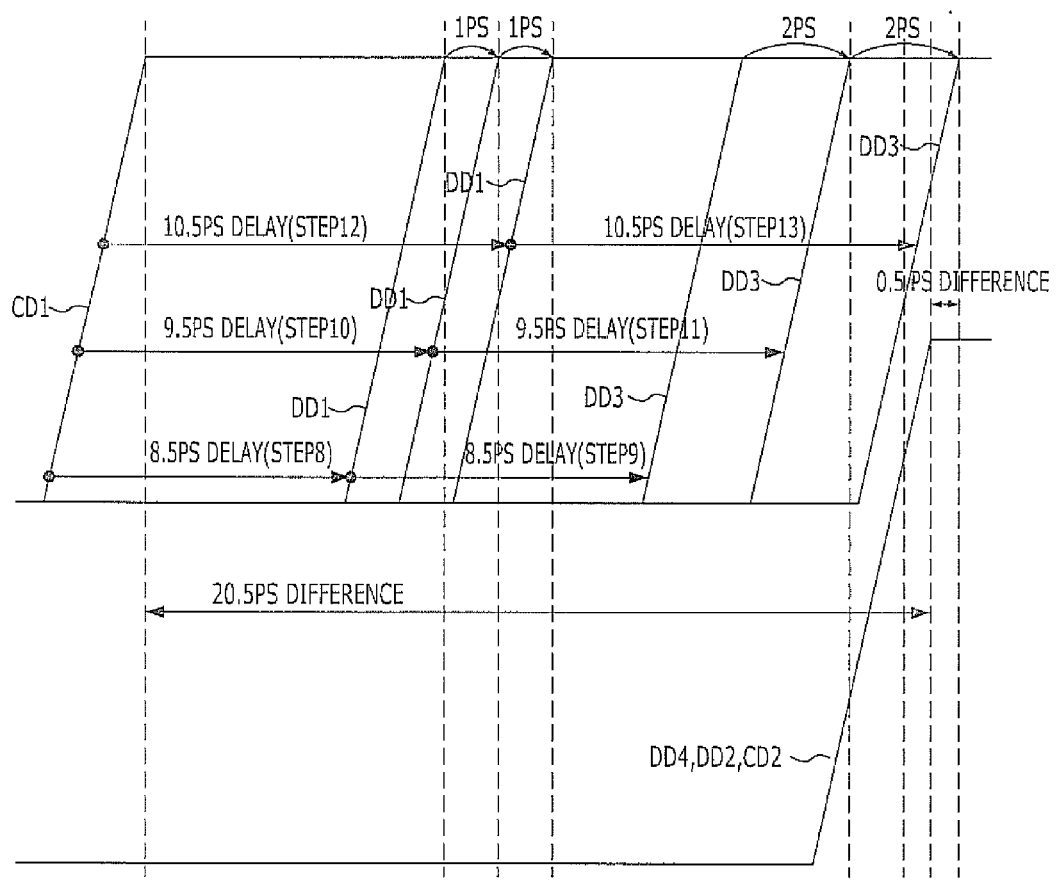
FIG. 7 is a timing diagram showing a procedure in which the third delay value of the third delay unit shown in FIG. 6 is calibrated in a calibration mode.

An operation for controlling the second delay value of the second delay unit 200 is the same as the delay value controlling operation described above with reference to FIG. 5. Hereinafter, an operation for controlling the third delay value of the third delay unit 300 after the second delay value of the second delay unit 200 is controlled to 19.5 ps will be described with reference to FIG. 7.

The third phase comparison unit 350 compares the phases of the signal loaded on the third first-node CD1 and the signal loaded on the third second-node CD2, and, since the phase of the signal loaded on the third first-node CD1 is earlier by 20.5 ps than the phase of the signal loaded on the third second-node CD2, generates the third up/down signal Q<2> of the high level and transfers it to the third delay unit 300. The third delay unit 300 delays the signal loaded on the third first-node CD1 by the third delay value of 8.5 ps between the signal loaded on the third first-node CD1 and the signal loaded on the third second-node CD2 in response to the third up/down signal Q<2> of the high level and transfers the delayed signal to the fourth first-node DD1, and transfers the signal loaded on the third second-node CD2 to the fourth second-node DD2 as is without further delaying the signal. Accordingly, the phase of the signal loaded on the fourth first-node DD1 is earlier by 12 ps than the phase of the signal loaded on the fourth second-node DD2 (STEP8).

The second replica delay unit 610 delays the signal loaded on the fourth first-node DD1 by the third delay value of 8.5 ps between the signal loaded on the fourth first-node DD1 and the signal loaded on the fourth second-node DD2 in response to the third up/down signal Q<2> of the high level and transfers the delayed signal to the fourth third-node DD2, and transfers the signal loaded on the fourth second-node DD2 to the fourth fourth-node DD4 as is without further delaying the signal. Accordingly, the phase of the signal loaded on the fourth third-node DD3 is earlier by 3.5 ps than the phase of the signal loaded on the fourth fourth-node DD4 (STEP9).

Since the phase of the signal loaded on the fourth third-node DD3 is earlier than the phase of the signal loaded on the fourth fourth-node DD4, the second calibrating phase comparing section 621 generates the second calibrating up/down signal R<2> of the high level and transfers it to the second control section 622. The second control section 622 increases the value of the second delay codes CTR2<1:4> in response to the second calibrating up/down signal R<2> of the high level and transfers it to the third delay unit 300 and the second replica delay unit 610. Accordingly, the third delay value of the third delay unit 300 is increased to 9.5 ps, and the delay value of the second replica delay unit 610 is also increased to 9.5 ps.

Subsequently, the above-described operations are repeated. That is to say, the third delay unit 300 delays the signal loaded on the third first-node CD1 by 9.5 ps in response to the third up/down signal Q<2> of the high level and transfers the delayed signal to the fourth first-node DD1, and transfers the signal loaded on the third second-node CD2 to the fourth second-node DD2 as is without further delaying the signal (STEP10).

The second replica delay unit 610 delays the signal loaded on the fourth first-node DD1 by the third delay value of 9.5 ps in response to the third up/down signal Q<2> of the high level and transfers the delayed signal to the fourth third-node DD3, and transfers the signal loaded on the fourth second-node DD2 to the fourth fourth-node DD4 as is without further delaying the signal. Accordingly, the phase of the signal loaded on the fourth third-node DD3 is earlier by 1.5 ps than the phase of the signal loaded on the fourth fourth-node DD4 (STEP11).

Since the phase of the signal loaded on the fourth third-node DD3 is earlier than the phase of the signal loaded on the fourth fourth-node DD4, the second calibrating phase comparing section 621 generates the second calibrating up/down signal R<2> of the high level and transfers it to the second control section 622. The second control section 622 increases the value of the second delay codes CTR2<1:4> in response to the second calibrating up/down signal R<2> of the high level and transfers it to the third delay unit 300 and the second replica delay unit 610. Accordingly, the third delay value of the third delay unit 300 is increased by 1 ps to 10.5 ps. The delay value of the second replica delay unit 610 is also increased to 10.5 ps.

Thereupon, the above-described operations are repeated again. That is to say, the third delay unit 300 delays the signal loaded on the third first-node CD1 by 10.5 ps in response to the third up/down signal Q<2> of the high level and transfers the delayed signal to the fourth first-node DD1, and transfers the signal loaded on the third second-node CD2 to the fourth second-node DD2 as is without further delaying the signal (STEP12).

The second replica delay unit 610 delays the signal loaded on the fourth first-node DD1 by the third delay value of 10.5 ps in response to the third up/down signal Q<2> of the high level and transfers the delayed signal to the fourth third-node DD3, and transfers the signal loaded on the fourth second-node DD2 to the fourth fourth-node DD4 as is without further delaying the signal. Accordingly, the phase of the signal loaded on the fourth fourth-node DD4 is earlier by 0.5 ps than the phase of the signal loaded on the fourth third-node DD3 (STEP13).

Since the phase of the signal loaded on the fourth fourth-node DD4 is earlier than the phase of the signal loaded on the fourth third-node DD3, the second calibrating phase comparing section 621 generates the second calibrating up/down signal R<2> of the low level and outputs it to the second control section 622. The second control section 622 decreases the value of the second delay codes CTR2<1:4> in response to the second calibrating up/down signal R<2> of the low level and transfers it to the third delay unit 300 and the second replica delay unit 610. The delay value of the third delay unit 300 is decreased by 1 ps and is controlled to 9.5 ps. The delay value of the second replica delay unit 610 is also decreased by 1 ps and is controlled to 9.5 ps.

As a result, the third delay value of the third delay unit 300 is consecutively changed from 9.5 ps to 10.5 ps and subsequently from 10.5 ps to 9.5 ps until the calibration mode is ended, that is, the mode signal MODE transitions from the high level to the low level. The third delay value of the third delay unit 300 is locked to any one value of 9.5 ps and 10.5 ps by the second delay codes CTR2<1:4> when the calibration mode is ended (that is, when the mode signal MODE has the high level). Through this, the second delay value of the second delay unit 200 and the third delay value of the third delay unit 300 may maintain approximately the ratio of 2:1.

In the meantime, the difference between the operation in which the delay value control circuit 2000 controls the delay value of the third delay unit in the above-described first modification of the embodiment shown in FIG. 3 and the operation in which the phase difference quantization circuit shown in FIG. 6 controls the delay value of the third delay unit 300 is as follows. In the first modification of the embodiment shown in FIG. 3, the phases of the signal generated by delaying an input signal by the second delay value through the second delay unit 200 and the signal generated by delaying the input signal by (the third delay value*2) are compared with each other, and the third delay value of the third delay unit is controlled using a comparison result. However, in the phase difference quantization circuit shown in FIG. 6, the phases of the signal generated by delaying an input signal by the first delay value through the first delay unit 100 and the signal generated by delaying the input signal by (the second delay value+the third delay value*2) are compared with each other, and the third delay value of the third delay unit is controlled using a comparison result.

Figure 8:
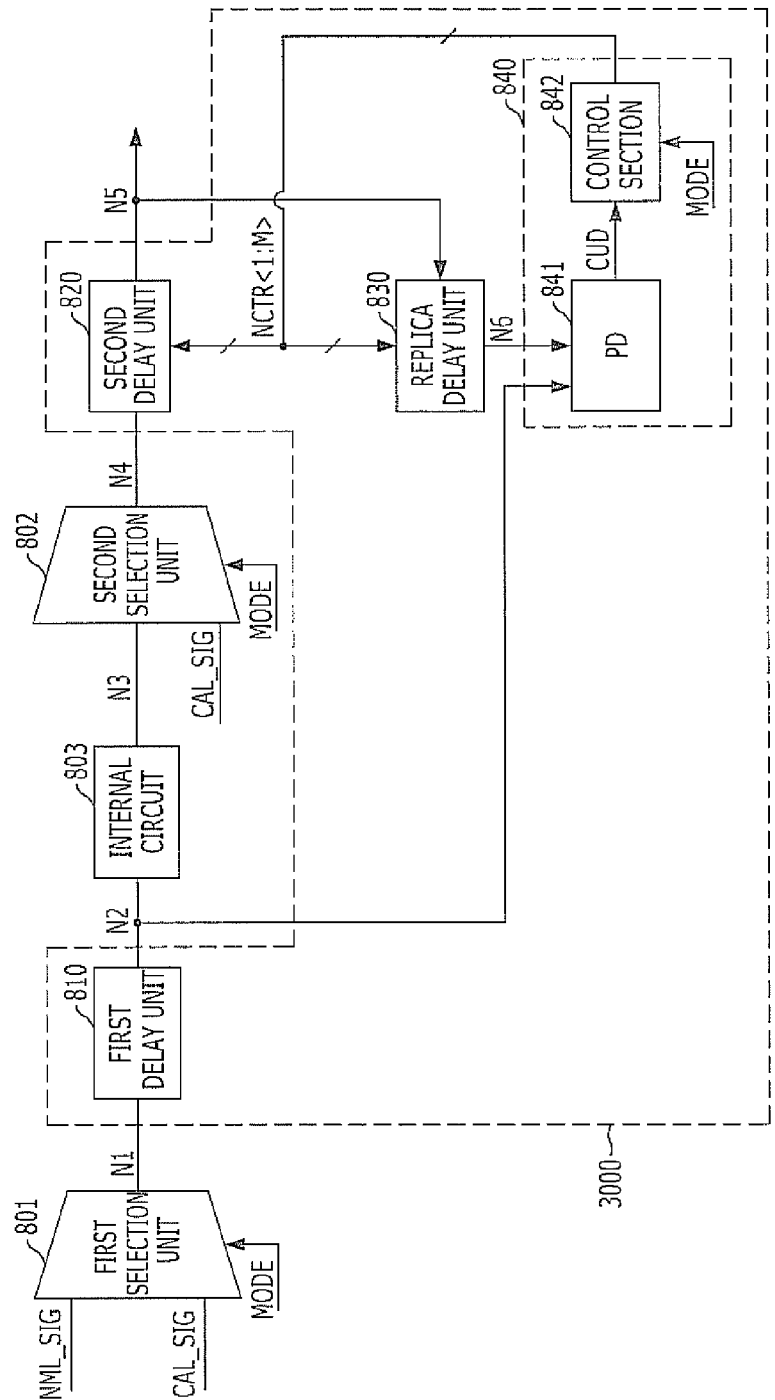
FIG. 8 is a diagram showing an exemplary embodiment of an integrated circuit in which a delay circuit in accordance with an embodiment of the present invention is used.

FIG. 8 is a diagram showing an exemplary embodiment of an integrated circuit in which a delay circuit 3000 in accordance with an embodiment of the present invention is used. For illustration purposes, FIG. 8 shows an example of an integrated circuit in which the delay circuit 3000 is used. The present embodiment may be applied, without limitations, to any circuits so long as the ratio between the two units delay value of a first delay unit 810 and the one unit delay value of a second delay unit 820 is constantly maintained at 2:1.

The integrated circuit may include a first selection unit 801, the delay circuit 3000, an internal circuit 803, and a second selection unit 802. The delay circuit 3000 according to the present embodiment may include the first delay unit 810, the second delay unit 820, a replica delay unit 830, and a delay control unit 840.

The first selection unit 801 is configured to select any one of a normal signal NML_SIG and a calibration signal CAL_SIG in response to a mode signal MODE and output the selected signal to the first delay unit 810. As described above with reference to FIG. 3, the mode signal MODE is a signal which represents a normal mode or a calibration mode. In detail, the mode signal MODE of a high level may be controlled so as to represent the calibration mode and the mode signal MODE of a low level may be controlled so as to represent the normal mode. The first selection unit 801 may be designed in such a way as to output the normal signal NML_SIG to the first delay unit 810 in the normal mode (that is, when the mode signal MODE has the low level) and output the calibration signal CAL_SIG to the first delay unit 810 in the calibration mode (that is, when the mode signal MODE has the high level).

Figure 9:
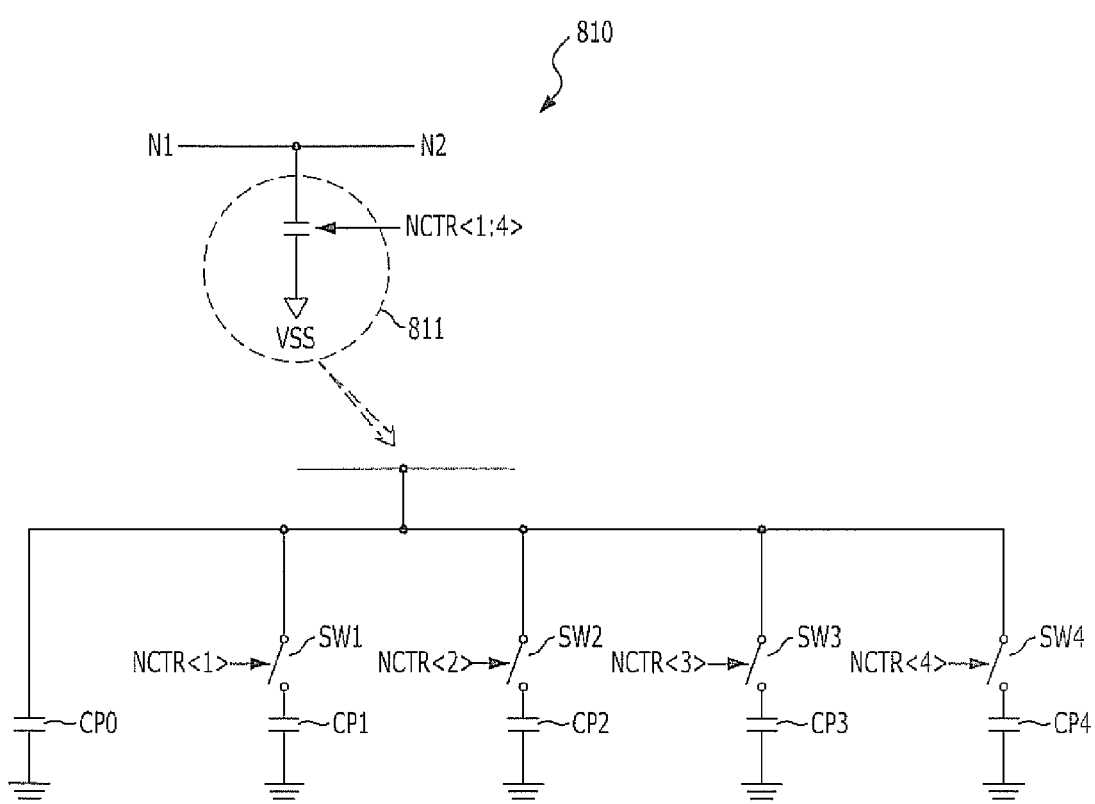
FIG. 9 is a diagram showing an exemplary embodiment of the first delay unit shown in FIG. 8.

The first delay unit 810 is configured to delay the signal loaded on a first node N1 by a two units delay value. The signal delayed by the first delay unit 810 is transferred to the internal circuit 803 and the delay control unit 840. In detail, referring to FIG. 9; the first delay unit 810 may include a capacitor section 811. The first delay unit 810 delays the signal loaded on the first node N1 by the delay value determined by the total capacitance of the capacitor section 811 and outputs the delayed signal to a second node N2. The capacitor section 811 includes a plurality of capacitors CP0 to CP4 and a plurality of switches SW1 to SW4. For illustration purposes, FIG. 9 illustrates the case in which the capacitor section 811 includes five capacitors CP0 to CP4 and fourth switches SW1 to SW4. The plurality of switches SW1 to SW4 are turned on and off in response to delay codes NCTR<1:4>. The configuration and operation of the capacitor section 811 are similar to those of the capacitor section 220 described above with reference to FIG. 4.

The internal circuit 803 is configured to be inputted with the signal loaded on the second node N2, perform a specified operation using the inputted signal and subsequently transfers a resultant value to a third node N3. The internal circuit 803 means a circuit which constitutes the integrated circuit and performs the specified operation.

The second selection unit 802 is configured to select any one of the output signal of the internal circuit 803, that is, the signal loaded on the third node N3, and the calibration signal CAL_SIG in response to the mode signal MODE and output the selected signal to the second delay unit 820. In detail, the second selection unit 802 may be designed in such a way as to output the signal loaded on the third node N3 to the second delay unit 820 in the normal mode (that is, when the mode signal MODE has the low level) and output the calibration signal CAL_SIG to the second delay unit 820 in the calibration mode (that is, when the mode signal MODE has the high level).

The second delay unit 820 is configured to delay the output signal of the second selection unit 802, that is, the signal loaded on a fourth node N4, by a one unit delay value. The signal delayed by the second delay unit 820 is transferred to another internal circuit (not shown) and the replica delay unit 830. In detail, the second delay unit 820 may include a capacitor section as in the first delay unit 810 shown in FIG. 9, and delays the signal loaded on the fourth node N4 by the delay value determined by the total capacitance of the capacitor section and outputs the delayed signal to a fifth node N5.

The replica delay unit 830 is configured in the same way as the second delay unit 820, and the delay value of the replica delay unit 830 is the same as the one unit delay value of the second delay unit 820. The replica delay unit 830 is configured to delay the signal loaded on the fifth node N5 by the one unit delay value and transfers the delayed signal to the delay control unit 840.

The delay control unit 840 is configured to compare the phases of the signal loaded on the second node N2 and the signal loaded on a sixth node N6 (that is, the signal transferred from the replica delay unit 830) and control the delay value of the second delay unit 820 using a comparison result. The delay control unit 840 controls the total capacitance of the capacitor section of the second delay unit 820 and controls the delay value of the second delay unit 820. The configuration and operation of the delay control unit 840 are similar to those of the delay control unit 420 described above with reference to FIG. 3. In detail, the delay control unit 840 may include a phase comparing section 841 and a control section 842.

The phase comparing section 841 is configured to compare the phases of the signal loaded on the second node N2 and the signal loaded on the sixth node N6 and output a calibrating up/down signal CUD. In detail, the phase comparing section 841 may be designed in such a way as to generate and output the calibrating up/down signal CUD of a high level when the phase of the signal loaded on the sixth node N6 is earlier than the phase of the signal loaded on the second node N2, and generate and output the calibrating up/down signal CUD of a low level when the phase of the signal loaded on the second node N2 is earlier than the phase of the signal loaded on the sixth node N6.

The control section 842 is configured to generate delay codes NCTR<1:M> for controlling the delay value of the second delay unit 820 and the replica delay unit 830, in response to the calibrating up/down signal CUD, and transfer the delay codes NCTR<1:M> to the second delay unit 820 and the replica delay unit 830. In detail, the control section 842 may be designed in such a way as to increase the value of the delay codes NCTR<1:M> in response to the calibrating up/down signal CUD of the high level and decrease the value of the delay codes NCTR<1:M> in response to the calibrating up/down signal CUD of the low level.

Since the delay control unit 840 performs the operation for controlling, for example, the delay value of the second delay unit 820 only in the calibration mode (that is, when the mode signal MODE has the high level), the delay value controlling operation described above may be controlled so as not to be performed in the normal mode (that is, when the mode signal MODE has the low level) to lock the delay value of the second delay unit 820.

The operations of the integrated circuit shown in FIG. 8 will be described below.

First, operations of the integrated circuit in the normal mode (that is, when the mode signal MODE has the low level) are as follows. In the normal mode (that is, when the mode signal MODE has the low level), the first selection unit 801 outputs the normal signal NML_SIG to the first delay unit 810. The first delay unit 810 delays the inputted signal by the two units delay value and transfers the delayed signal to the internal circuit 803. The internal circuit 803 performs the specified operation using the signal loaded on the second node N2 and transfers the resultant value to the third node N3. The second selection unit 802 outputs the signal loaded on the third node N3 to the second delay unit 820 in response to the mode signal MODE of the low level. The second delay unit 820 delays the signal loaded on the fourth node N4 by the one unit delay value and transfers the delayed signal to another internal circuit.

Figure 10:
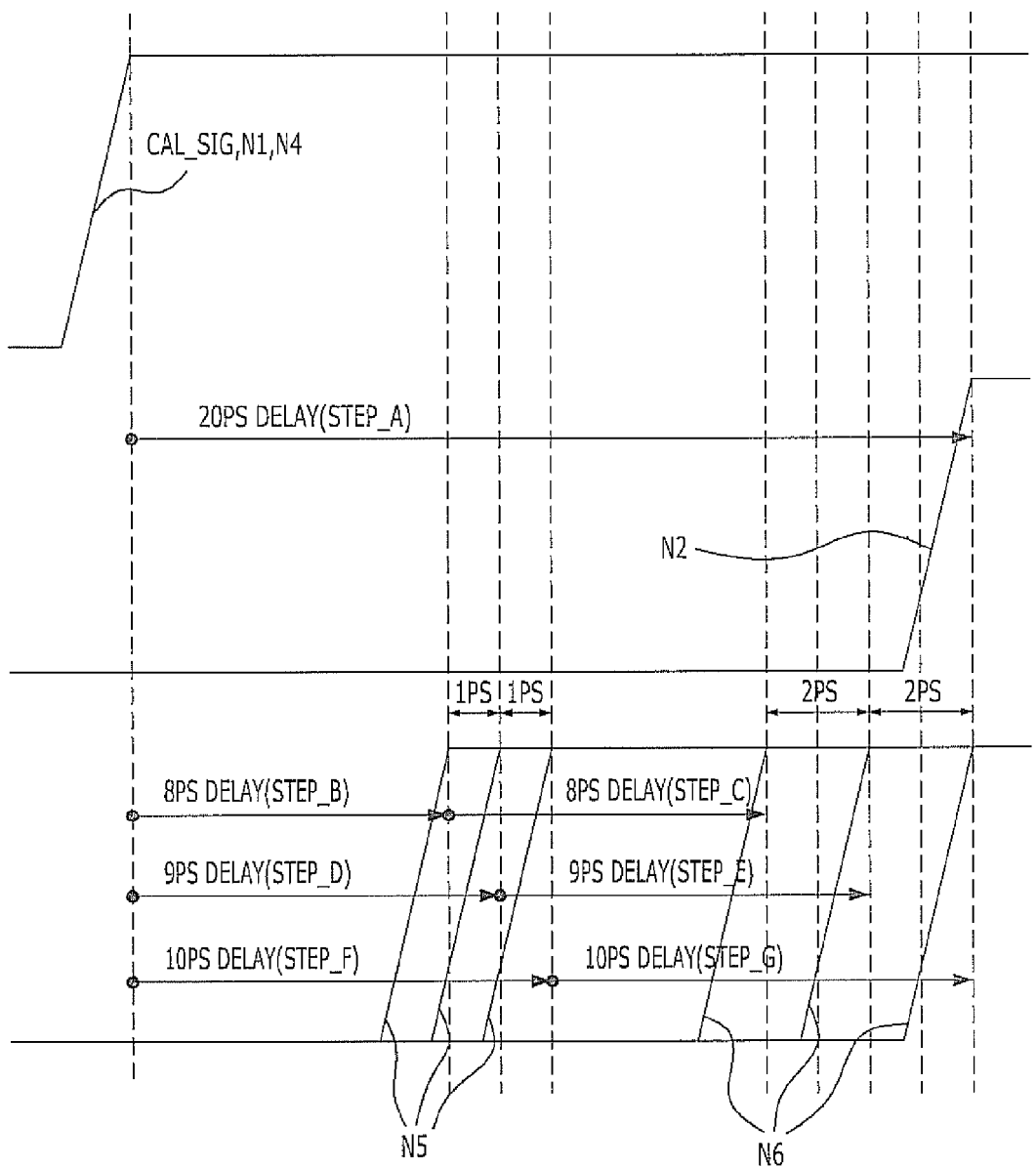
FIG. 10 is a timing diagram showing calibrating operations of the delay circuit shown in FIG. 8 in a calibration mode.

Operations of the integrated circuit in the calibration mode (that is, when the mode signal MODE has the high level) will be described below with reference to FIG. 10. For illustration purposes, the following assumptions are made. ① It is assumed that the delay value of the first delay unit 810 is 20 ps and the delay value of the second delay unit 820 is changed from 10 ps to 8 ps due to a variation in PVT, and, since the replica delay unit 830 is configured in the same way as the second delay unit 820 and a change in the delay value of the replica delay unit 830 due to the variation in PVT occurs in the same manner as in the second delay unit 820, the delay value of the replica delay unit 830 is also changed from 10 ps to 8 ps due to the variation in PVT. ② It is assumed that the phase comparing section 841 generates the calibrating up/down signal CUD of the high level when the phase of the signal loaded on the sixth node N6 is earlier than the phase of the signal loaded on the second node N2 and generates the calibrating up/down signal CUD of the low level in an opposite case. ③ The control section 842 decreases the value of the delay codes NCTR<1:M> when the calibrating up/down signal CUD has the low level and increases the value of the delay codes NCTR<1:M> when the calibrating up/down signal CUD has the high level, and ④, as the number of capacitors to be turned in response to the delay codes NCTR<1:M> increases/decreases by one, the delay value of the second delay unit 820 increases/decreases by 1 ps.

First, the first selection unit 801 outputs the calibration signal CAL_SIG to the first delay unit 810 in response to the mode signal MODE of the high level.

The signal transferred from the first selection unit 801, that is, the signal loaded on the first node N1, is delayed by 20 ps through the first delay unit 810, and is subsequently transferred to the phase comparing section 841 of the delay control unit 840 (STEP_A).

The second selection unit 802 outputs the calibration signal CAL_SIG to the second delay unit 820 in response to the mode signal MODE of the high level.

The signal transferred from the second selection unit 802, that is, the signal loaded on the fourth node N4, is delayed by 8 ps through the second delay unit 820, and is subsequently transferred to the replica delay unit 830 (STEP_B). The replica delay unit 830 delays the inputted signal, that is, the signal loaded on the fifth node N5, again by 8 ps, and subsequently transfers the delayed signal to the phase comparing section 841 of the delay control unit 840 (STEP_C). Accordingly, the phase of the signal transferred from the replica delay unit 830 (that is, the signal loaded on the sixth node N6) is earlier by 4 ps than the phase of the signal loaded on the second node N2.

The phase comparing section 841 of the delay control unit 840 compares the phases of the signal loaded on the second node N2 and the signal loaded on the sixth node N6, and since the phase of the signal loaded on the sixth node N6 is earlier than the phase of the signal loaded on the second node N2, generates the calibrating up/down signal CUD of the high level and transfers it to the control section 842. The control section 842 performs an operation for controlling the delay codes NCTR<1:M> in response to the mode signal MODE of the high level. In detail, the control section 842 increases the value of the delay codes NCTR<1:M> in response to the calibrating up/down signal CUD of the high level and transfers it to the second delay unit 820 and the replica delay unit 830. The delay value of the second delay unit 820 is increased by 1 ps through the delay codes NCTR<1:M> and is controlled to 9 ps. The delay value of the replica delay unit 830 is also increased by 1 ps through the delay codes NCTR<1:M> and is controlled to 9 ps.

Subsequently, the above-described operations are repeated. That is to say, the signal transferred from the second selection unit 802 (that is, the signal loaded on the fourth node N4) is delayed by 9 ps through the second delay unit 820 and is subsequently loaded on the fifth node N5 (STEP_D). Furthermore, the replica delay unit 830 delays the signal loaded on the fifth rode N5 again by 9 ps and transfers the delayed signal to the sixth node N6 (STEP_E). The delay control unit 840 compares the phases of the signal loaded on the second node N2 and the signal loaded on the sixth node N6, and, since the phase of the signal loaded on the sixth node N6 is earlier than the phase of the signal loaded on the second node N2 by 2 ps, increases the value of the delay codes NCTR<1:M> and transfers it to the second delay unit 820 and the replica delay unit 830. Due to this fact, the delay value of the second delay unit 820 is increased to 10 ps, and the delay value of the replica delay unit 830 is also increased to 10 ps.

Thereupon, the above-described operations are repeated again. That is to say, the signal transferred from the second selection unit 802 (that is, the signal loaded on the fourth node N4) is delayed by 10 ps through the second delay unit 820 and is subsequently loaded on the fifth node N5 (STEP_F). Furthermore, the replica delay unit 830 delays the signal loaded on the fifth node N5 again by 10 ps and transfers the delayed signal to the sixth node N6 (STEP_G).

During the calibration mode, that is, during a period in which the mode signal MODE is activated to the high level, the above-described operations are repeated, the value of the delay codes NCTR<1:M> is controlled, and thus, the delay value of the second delay unit 820 is changed. The delay value of the second delay unit 820 is finally determined by the delay codes NCTR<1:M> when the calibration mode is ended, that is, when the mode signal MODE transitions from the high level to the low level. As a result, the delay value of the second delay unit 820 is controlled to be half of the delay value of the first delay unit 810, that is, 10 ps, so that the delay value of the first delay unit 810 and the delay value of the second delay unit 820 may maintain the ratio of 2:1.

While the case in which the delay value of the second delay unit 820 is controlled in response to the delay codes NCTR<1:M> was described as an example, it is to be noted that the delay circuit 3000 according to the embodiment of the present invention may be designed such that the delay value of the first delay unit 810 is controlled in response to the delay codes NCTR<1:M>. In this case, the delay control unit 840 may be designed in such a way as to compare the phases of the signal loaded on the second node N2 and the signal loaded on the sixth node N6 and control the delay value of the first delay unit 810 using a comparison result. For example, in the case where the delay value of the first delay unit 810 is 20 ps and the delay value of the second delay unit 820 is changed from 10 ps to 8.5 ps due to a variation in PVT, the delay control unit 840 decreases the value of the delay codes NCTR<1:M> and transfers it to the first delay unit 810 and the delay value of the first delay unit 810 is decreased in response to the inputted delay codes NCTR<1:M>. Furthermore, design may be made such that, in the case where the delay value of the second delay unit 820 is 10 ps and the delay value of the first delay unit 810 is changed from 20 ps to 18 ps due to a variation in PVT, the delay control unit 840 increases the value of the delay codes NCTR<1:M> and transfers it to the first delay unit 810 and the delay value of the first delay unit 810 is increased in response to the inputted delay codes NCTR<1:M>.

Here, the case in which the delay value ratio of the first delay unit 810 and the second delay unit 820 constituting the delay circuit is 2:1 has been described as an example. In the case where the delay value ratio of the first delay unit 810 and the second delay unit 820 is K:1 (K is an integer equal to or greater than 2), the delay value ratio of the first delay unit 810 and the second delay unit 820 is constantly maintained at K:1 by disposing K−1 number of replica delay units 831 and 832 as shown in FIG. 11.

A delay circuit 3000 may include a first delay unit 810 with a K units delay value, a second delay unit 820 with a one unit delay value, the K−1 number of replica delay units 831 and 832 configured in the same way as the second delay unit 820, and a delay control unit 840. For illustration purposes, FIG. 11 illustrates that K is 3, that is, the delay circuit 3000 includes the first delay unit 810 with a three units delay value and two replica delay units 831 and 832.

Figure 11:
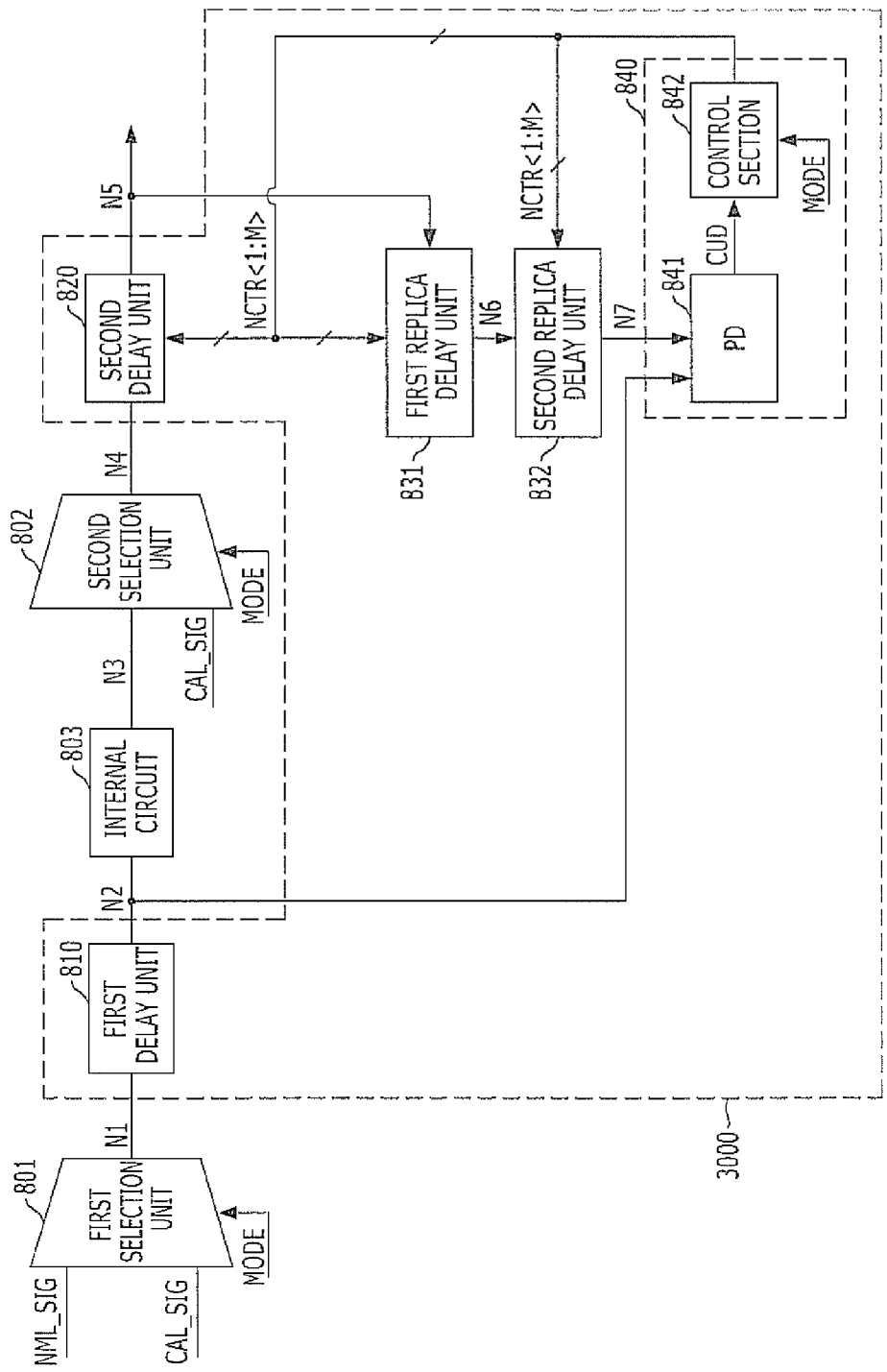
FIG. 11 is a diagram showing another exemplary embodiment of an integrated circuit in which a delay circuit in accordance with another embodiment of the present invention is used.

The configuration and operating principle of the delay circuit 3000 shown in FIG. 11 are similar to those of the delay circuit 3000 described above with reference to FIG. 8. Here, differences between the calibrating operations of the delay circuit 3000 shown in FIG. 11 and the calibrating operations of the delay circuit 3000 described above with reference to FIG. 8 in the calibration mode (that is, when the mode signal MODE has the high level) will be described. For illustration purposes, the following assumptions are made. ① It is assumed that the delay value of the first delay unit 810 is 30 ps and the delay value of the second delay unit 820 is changed from 10 ps to 7 ps due to a variation in PVT, and, since the first and second replica delay units 831 and 832 are configured in the same way as the second delay unit 820, the delay value of the each of the first and second replica delay units 831 and 832 is also changed from 10 ps to 7 ps due to the variation in PVT. ② It is assumed that a phase comparing section 841 generates a calibrating up/down signal CUD of a high level when the phase of the signal loaded on a seventh node N7 is earlier than the phase of the signal loaded on a second node N2 and generates the calibrating up/down signal CUD of a low level in an opposite case. ③ A control section 842 decreases the value of delay codes NCTR<1:M> when the calibrating up/down signal CUD has the low level and increases the value of the delay codes NCTR<1:M> when the calibrating up/down signal CUD has the high level, and ④ as the number of capacitors to be turned in response to the delay codes NCTR<1:M> increases/decreases by one, the delay value of the second delay unit 820 increases/decreases by 1 ps.

In the calibration mode (that is, when the mode signal MODE has the high level), the first delay unit 810 delays a calibration signal CAL_SIG by 30 ps and transfers the delayed signal to the second node N2. The second delay unit 820 delays the calibration signal CAL_SIG loaded on a fourth node N4 by 7 ps and transfers the delayed signal to a fifth node N5. The first replica delay unit 831 delays the signal loaded on the fifth node N5 again by 7 ps and transfers the delayed signal to a sixth node N6. The second replica delay unit 832 delays the signal loaded on the sixth node N6 again by 7 ps and transfers the delayed signal to the seventh node N7. The delay control unit 840 compares the phases of the signal loaded on the second node N2 and the signal loaded on the seventh node N7, and, since the phase of the signal loaded on the seventh node N7 is earlier by 9 ps than the phase of the signal loaded on the second node N2, increases the value of the delay codes NCTR<1:M> and transfers it to the second delay unit 820 and the first and second replica delay units 831 and 832. Due to this fact, the delay value of the second delay unit 820 is increased by 1 ps and is controlled to 8 ps. The delay value of each of the first and second replica delay units 831 and 832 is increased by 1 ps and is controlled to 8 ps.

The above-described operations are repeated during the calibration mode, that is, during a period in which the mode signal MODE is activated to the high level. The delay value of the second delay unit 820 is finally determined by the delay codes NCTR<1:M> when the calibration mode is ended, that is, when the mode signal MODE transitions from the high level to the low level. As a result, the delay value of the second delay unit 820 is controlled to the one thirds magnitude of the delay value of the first delay unit 810, that is, 10 ps, so that the delay value of the first delay unit 810 and the delay value of the second delay unit 820 may maintain the ratio of 3:1.

As is apparent from the above descriptions, in the phase difference quantization circuit according to the embodiments of the present invention, since the delay value ratios of delay units constituting the phase difference quantization circuit are kept constant, digital codes which precisely reflect a phase difference between two signals may be generated.

Furthermore, in the delay circuit according to the embodiments of the present invention, a signal may be delayed while keeping the delay value ratios of delay units constant.

While the present invention has been described with respect to the specific embodiments, it will be apparent to those skilled in the art that various changes and modifications may be made without departing from the spirit and scope of the invention as defined in the following claims.

What is claimed is:

1. A delay value control circuit of a phase difference quantization circuit, wherein the phase difference quantization circuit has first to $N^{th}$ (N is an integer equal to or greater than 2) delay units with binary weights, the delay value control circuit comprising:
    a replica delay unit replicating an $A^{th}$ ($2 \leq A \leq N$) delay unit; and
    a delay control unit configured to compare a phase of a first output signal generated from delaying an input signal with an $A-1^{th}$ delay unit and a phase of a second output signal generated from delaying the input signal with the $A^{th}$ delay unit and the replica delay unit and configured to control a delay value of the $A^{th}$ delay unit using a comparison result.

2. The delay value control circuit of claim 1, wherein the $A^{th}$ delay unit is configured to delay the input signal using a capacitor section and the delay control unit is configured to control a capacitance of the capacitor section of the $A^{th}$ delay unit.

3. The delay value control circuit of claim 1, wherein the delay control unit comprises:
    a phase comparing section configured to compare the phase of the first output signal and the phase of the second output signal and output an up/down signal; and
    a control section configured to generate delay codes for controlling the delay value of the $A^{th}$ delay unit and the replica delay unit in response to the up/down signal.

4. A delay value control circuit of a phase difference quantization circuit, wherein the phase difference quantization circuit has first to $N^{th}$ (N is an integer equal to or greater than 2) delay units with binary weights, the delay value control circuit comprising:
    a replica delay unit replicating an $A^{th}$ ($2 \leq A \leq N$) delay unit; and a delay control unit configured to compare a phase of a first output signal generated from delaying an input signal with an $A-1^{th}$ delay unit and a phase of a second output signal generated from delaying the input signal with the $A^{th}$ delay unit and the replica delay unit and configured to control a delay value of the $A-1^{th}$ delay unit using a comparison result.

* * * * *